United States Patent
Lackey et al.

[11] Patent Number: 5,916,633
[45] Date of Patent: Jun. 29, 1999

[54] FABRICATION OF CARBON/CARBON COMPOSITES BY FORCED FLOW-THERMAL GRADIENT CHEMICAL VAPOR INFILTRATION

[75] Inventors: Walter Jackson Lackey, Marietta; Sundar Vaidyaraman, Atlanta, both of Ga.

[73] Assignee: Georgia Tech Research Corporation, Atlanta, Ga.

[21] Appl. No.: 08/445,425

[22] Filed: May 19, 1995

[51] Int. Cl.$^6$ ................................................ C23C 16/26
[52] U.S. Cl. .......................... 427/249; 427/8; 427/255.1; 427/228
[58] Field of Search .................. 427/8, 249, 255.1, 427/228

[56] References Cited

U.S. PATENT DOCUMENTS

| | | | |
|---|---|---|---|
| 4,580,524 | 4/1986 | Lackey, Jr. et al. | 118/725 |
| 5,348,774 | 9/1994 | Golecki et al. | 427/543 |
| 5,480,678 | 1/1996 | Rudolph et al. | 427/248.1 |

OTHER PUBLICATIONS

Kimura, et al., High Temp. High Press. 13, 193 (1980) (month unknown).
Beaty, R.L. and D.V. Kiplinger, Nucl. Appl. Tech., 8, 488 (1970) (month unknown).
Sugiyama, K., and T. Nakamura, J. Mat. Sci. Lett., 6, 331, (1987) (month unknown).
Buckley, J.D., and Dan D. Edie, Noyes Publications, Park Ridge, N.J., pp. 111–118, and 211–215 (1993) (month unknown).
Lackey, W.J., T.L. Starr, Fiber Reinforced Ceramic Composites, ed. by K.S. Mazdiyansi, 397–449 (Noyes Publications, N.J. 1991) (month unknown).
Vaidyaraman, S., W.J. Lackey, G.B. Freeman, P.K. Agrawa, and M.D. Langman, J. Mat. Res., vol. 10, No. 6, Jun., 1995.
McAllister, P., J.F. Hendricks and E.E. Wolf, Carbon, 28, 579 (1990) (month unknown).
Oh, S.H., and J.Y. Lee, Carbon, 26, 763–769 (1988) (month unknown).
Box, G.E.P. and D.R. Cox, J. Royal Stat. Soc. B., 26. 211 (1964) (month unknown).
Caputo, A.J., R.A. Lowden and D.P. Stinton, Improvements in the Fabrication of Ceramic–Fiber–Ceramic–Matrix Composites by Chemical Vapor Infiltration, ORNL/TM–9651, Oak Ridge Nat. Lab., Oak Ridge, TN (Jun. 1985).
Tesner, P.A., Chemistry and Physics of Carbon, ed. P.A. Thrower, 19, 65 (1983) (month unknown), pp. 66–161.
Oh, S.M., and J.Y. Lee, Carbon, 27, 423–430 (1989) (month unknown).
Marinkovic, S. and S. Dimitrijevic, Carbon, 23, 691–95 (1985) (month unknown).

(List continued on next page.)

*Primary Examiner*—Shrive Beck
*Assistant Examiner*—Timothy Meeks
*Attorney, Agent, or Firm*—Deveau, Colton & Marquis

[57] ABSTRACT

The fabrication of carbon/carbon composite disks using forced flow-thermal gradient chemical vapor infiltration process using propylene diluted with hydrogen as the reagent is disclosed. The independent variables included concentration of the reagent, total flow rate and preform bottom temperature. The response variables included infiltration time, final porosity, rate of weight gain and deposition rate. The infiltration time and rate of weight gain are affected only by the three independent variables. The densification of the composites is monitored by the back pressure. The composites were cut into slices 1 cm long, 4 mm wide and 2 mm deep to measure the uniformity of densification, which varied very little within a composite. Coating thickness as a function of position increased exponentially from the cold side to the hot side of the composite. The coating thicknesses near the cold side and the hot side are used to calculate the rate constant for the pyrolysis of propylene in the preform. The activation energy is approximately 18.6 Kcal/mol and the rate constant is given by 1n k=8.2—9375.1/T (K)

25 Claims, 23 Drawing Sheets

OTHER PUBLICATIONS

Savage, G. Carbon–Carbon Composites, Chapman & Hall, N.Y., 1993 (no month).

Thomas, C.R. ed., Essentials of Carbon–Carbon Composites, Royal Society of Chemistry, London, 1993. (no month).

Oh et al. Carbon, vol. 27, No. 3, pp. 423–430 (1989). (month unknown).

Vaidyaraman et al. "Rapid Processing of Carbon–Carbon Composites by Forced–Flow Thermal Gradient Chemical Vapor Infiltration", Materials Research Society Symposium Proceedings, v. 365, 1995, pp. 325–330 (month unknown).

Kotlensky, "A Review of CVD Carbon Infiltration of Porous Substrates", Proc. 16th Nat. Symposium of the Soc. of Aerospace Mat. & Proc. Eng., Apr., 1971, pp. 257–265.

FABRICATION OF CARBON/CARBON COMPOSITES BY FORCED FLOW-THERMAL GRADIENT CHEMICAL VAPOR INFILTRATION

BACKGROUND OF THE INVENTION

1. Field of the Invention

This invention relates generally to the fabrication of carbon fiber-carbon matrix composites using forced flow thermal gradient chemical vapor infiltration techniques.

2. Prior Art

Carbon/carbon composites are unique materials in that they exhibit high specific strength, stiffness and toughness, and more importantly, the ability to retain these properties at elevated temperatures (1000–2000° C.). The applications of these materials include rocket nose cones, aircraft disc brakes, heat shields for re-entry vehicles, and heat sinks and radiators.

Carbon composites are at present fabricated using either an impregnation method or the isothermal chemical vapor infiltration (CVI) process. G. Savage, Carbon-Composites, Chapman & Hall, NY, 1993. In the impregnation method, the carbon preforms are impregnated with resin or pitch followed by carbonization and graphitization. Both the resin and pitch shrink during the carbonization and graphitization steps, necessitating numerous cycles of impregnation and carbonization to obtain dense carbon composites. Also, the carbon matrix produced by pyrolysis of resin does not graphitize easily below 3000° C. C. R. Thomas, ed., Essentials of Carbon-Carbon Composites, Royal Society of Chemistry, London, 1993. The isothermal chemical vapor infiltration process has been one of the most prevalent processes to fabricate carbon composites for high temperature applications. The main disadvantages of this process are long processing times (500–600 h), density gradients, and the need to machine the outer impermeable skin from the composite to facilitate infiltration.

Prior attempts have been made to overcome some of the above shortcomings with limited success. For example, a temperature gradient was applied across the thickness of the preform during the infiltration process so that a temperature at the surface away from the reagent source counteracts the effect of reduced reagent concentration due to diffusion, as shown by U.S. Pat. No. 5,348,774 to Golecki, et al. This results in more uniform densification. The processing time required by this temperature gradient process was found to be much shorter than isothermal CVI, however, the effect of diffusion becomes significant near the end of the infiltration causing significant reductions in the rate of densification. Kimura et al., High Temp. High Press., 13, 193 (1980) employed forced flow through the thickness of the preform and was able to reduce the processing time. But the depletion of reagent while flowing through the preform results in non-uniform densification and plugging of the flow path at the surface where the reagent first contacts the preform. Pulse CVD has also been used to infiltrate the composites. This process is described by R. L. Beaty and D. V. Kiplinger, Nucl. Appl. Tech., 8, 488 (1970); and K. Sugiyama and T. Nakamura, J. Mat. Sci. Lett. 6, 331, (1987). The main disadvantages of this method are the high number of pulses required to infiltrate the composites and the vacuum equipment. Hence, there is still a need for developing an infiltration process which will produce dense composites in a short time.

Carbon/carbon composites are at present fabricated using may cycles of resin or pitch impregnation followed by carbonization and frequently high temperature graphitization. Carbon/Carbon Materials and Composites, ed. by J. D. Buckley and Dan D. Edie, Noyes Publications, Park Ridge, N.J., pages 111–118 and 211–215 (1993). Since the resin and pitch shrink during the carbonization and graphitization steps, numerous cycles of impregnation have to be carried out to obtain sufficiently dense components. Isothermal chemical vapor infiltration (CVI) is also well established for the manufacture of carbon/carbon composites. In this process the reactors have to be operated at low pressures and temperatures in an attempt to obtain uniformly dense composites. The low temperatures coupled with low pressures lead to very low deposition rates, hence, this method requires infiltration times on the order of several weeks and is restricted to thin components. The limitations enumerated above for the various processes add considerably to the cost of the components and limit the application of this material. Some of these limitations can be overcome by using the forced flow-thermal gradient chemical vapor infiltration process which is often referred to as FCVI, as shown by U.S. Pat. No. 4,580,523 to Lackey et al. The main advantages of this process include reduced processing times due to forced flow of the reagent and uniform densification throughout the preform.

In the FCVI process a temperature gradient on the order of 200–500° C. is applied across the preform and the reagent gasses are forced to flow through the preform from the cold to the hot surface, as shown by FIG. 9. Ideally, it is desirable to obtain uniform deposition throughout the preform. This can be accomplished by choosing the reagent concentration and the temperature as well as the flow rate such that the high reagent concentration at the cold side offsets the lower temperature, and the lower concentration at the hot side offsets the high temperature resulting in a uniform deposition rate. Also, the temperature gradient helps in prevention of the formation of an impermeable skin at the surface of the preform that is first exposed to the reagent. This methodology allows the process to be operated at much higher temperatures than the isothermal process, thereby further reducing the processing time significantly. The forced flow-thermal gradient technique also offers greater flexibility in the selection of the processing conditions. It is not essential to use the low temperatures, pressures, and reagent concentrations as in the isothermal process. Consequently, there is a wider latitude in selection of the conditions to obtain deposits possessing the required microstructure and properties. W. J. Lackey and T. L. Starr, in *Fiber Reinforced Ceramic Composites*, ed. by K. S. Mazdiyansi, 397–449 (Noyes Publications, NJ, 1991).

The forced flow-thermal gradient chemical vapor infiltration process (FCVI) which incorporates the advantages of both forced flow and thermal gradient processes, has been found to be very effective in rapidly fabricating uniformly dense SiC/SiC composites. See, for example, U.S. Pat. No. 4,580,523 to Lackey, et al. The FCVI process is also applicable to the fabrication of carbon/carbon composites using propylene, propane, or methane. S. Vaidyaraman, W. J. Lackey, G. B. Freeman, P. K. Agrawal and M. D. Langman, J. Mat. Res., in press (1995). The present invention provides an in-depth quantitative understanding of the FCVI processing variables, that is, temperature, propylene concentration, and total flow rate on the infiltration time, final porosity and uniformity of the densification.

BRIEF SUMMARY OF THE INVENTION

Carbon fiber-carbon matrix composites are fabricated using forced flow-thermal gradient chemical vapor infiltration (FCVI). The preforms for the infiltration are prepared by stacking multiple layers of carbon cloth in a graphite holder so that the preforms approximately conform in dimension and shape to the inside walls of the holder. The preforms are infiltrated with carbon using propylene, propane or methane as a reactant, with hydrogen as a diluent. Composites with porosities as low as 7% can be processed within 3 hours. The highest deposition rate obtained is approximately 3 $\mu$m/h which is more than an order of magnitude faster than the typical value of 0.1–0.25 $\mu$m/h for the isothermal infiltration process. In the infiltrated composites, the tows in a cloth are appreciably infiltrated, independent of their position in the preform; whereas, the coating thickness between the tows and cloth layers strongly depends on the temperature, i.e., position within the preform.

The FCVI equipment is shown in FIG. 10. The details of the water cooled gas injector are shown in FIG. 11. The water cooled injector is responsible for the establishment of the thermal gradient across the preform. The bottom of the preform bolder assembly is cooled by the injector and the top is heated by the furnace. This leads to the development of the temperature gradient. The temperature inside the preform and the temperature gradient can be varied by either varying the height of the preform holder or the preform thickness. A taller holder or a thicker preform reduces the cooling effects due to the injector and vice versa. Three types of preform holders, (shown by FIG. 1) categorized by the distance they extend above the injector, can be employed. This distance was 2.54, 5.08, and 7.62 cm, for preform holders referred to as types 1, 2 and 3, respectively. A Grafoil (UCAR Carbon Company, Inc., Cleveland, Ohio) seal (FIG. 11) was used to ensure that the process gas stream was constrained to flow through the fibrous preform.

The preforms consist of 40 layers of T-300 plain weave carbon cloth oriented at 0-30-60°. A circular carbon cloth 4.8 cm in diameter was used to prepare the preform. The carbon cloth, obtained from Fabric Development Inc. (Quakertown, Pa.), consisted of a plain weave of T-300 fibers containing 3000 filaments per tow; each filament had a diameter of 7 $\mu$m. Typically forty layers of cloth are stacked in a graphite preform holder, as shown in FIG. 1. Table 1 summarizes the fiber volume, rate of weight gain, infiltration time, density, and calculated open and total porosity for the composites prepared by FCVI. Other preforms could be made from chopped fibers, other weaves, three dimensional weaves, particles, whiskers and other porous materials such as carbons and graphite. The temperature of the preform, when using the type 1 holder (~140–400° C.), is too low for carbon deposition. The type 2 preform holder, with temperatures for the bottom of the preform of ~840° C., is employed to fabricate carbon composites when propylene is used as the reagent. In the case of methane, the longer type 3 preform holder is used, as the typical pyrolysis temperature of methane (~1100–1400° C.) is much higher than that of propylene. In the case of propane, which requires intermediate deposition temperatures, the type 3 preform holder with a bottom temperature of ~940° C. is suitable for carbon deposition. The type 1 preform can be used in a temperature range of about 150–400° C., which typically is too low for carbon deposition. In order to obtain higher preform temperatures, the type 3 preform holder can be employed. The type 2 preform holder, which extends 6.985 cm above the gas injector is employed for the preferred embodiment, using propylene. The type 3 preform typically is used with methane. The height of the preform holder affects the temperature and the temperature gradient across the preform.

The bottom of the preform holder is cooled by a water cooled injector and the top of the preform is heated by a furnace resulting in the establishment of a temperature gradient. The pressure gradient forces the gas through the preform. Table 2 describes the reagents used in the infiltration runs. The process feed gas stream typically consists of a carbon source gas and a diluent. The carbon source gas employed for the infiltration runs includes propylene and methane and the diluent was hydrogen. The propylene is 99.5% pure, polymer purity (Matheson, East Rutherford, N.J.). The methane is 99.97% pure, ultra high purity, and hydrogen is 99.999% pure, ultra high purity (Holox, Atlanta, Ga.). The preferred feed gas consists of propylene with hydrogen as a diluent. As the infiltration progresses, reduction in porosity results in an increase in the back pressure. The runs typically are terminated once the back pressure reaches ~142 kPa (6 psig) for a standardized gas flow consisting of 100 cm$^3$/min of propylene and 100 cm$^3$/min of hydrogen. The temperatures of the preform top and bottom are monitored using K-type thermocouples during the infiltration. The infiltrated composite is removed intact from the holder after cooling the furnace.

The apparent volume of the composite is determined using Archimides' principle with methanol ($\rho$=0.79 g/cm$^3$). The open pore volume is calculated by weighing the composite saturated with methanol. These two values are added to obtain the bulk volume. As a check on bulk volume, the above procedure is repeated with distilled water.

Slices 1 cm long, 4 mm wide and 2 mm deep are cut out of the composite to determine the uniformity of the infiltration. Four slices are cut in the radial direction and three slices in the axial direction. Hence, there are twelve slices for one composite sample. The samples are called as hot, middle or cold side depending on the axial position of the slice and inside or outside depending on their radial position. The slices near the center of the composite are termed inside and the one which had the circumference of the composite as one side are termed outside. The densities of the slices are measured from their weight and volume. The volume is calculated from the dimension of the slice.

Slices of the composites, containing both hot and cold side, are mounted in epoxy and polished. The polished sections are observed via scanning electron microscopy to evaluate the uniformity of the infiltration.

DETAILED DESCRIPTION OF THE PREFERRED EMBODIMENTS

1. Process Design

Figure 1:
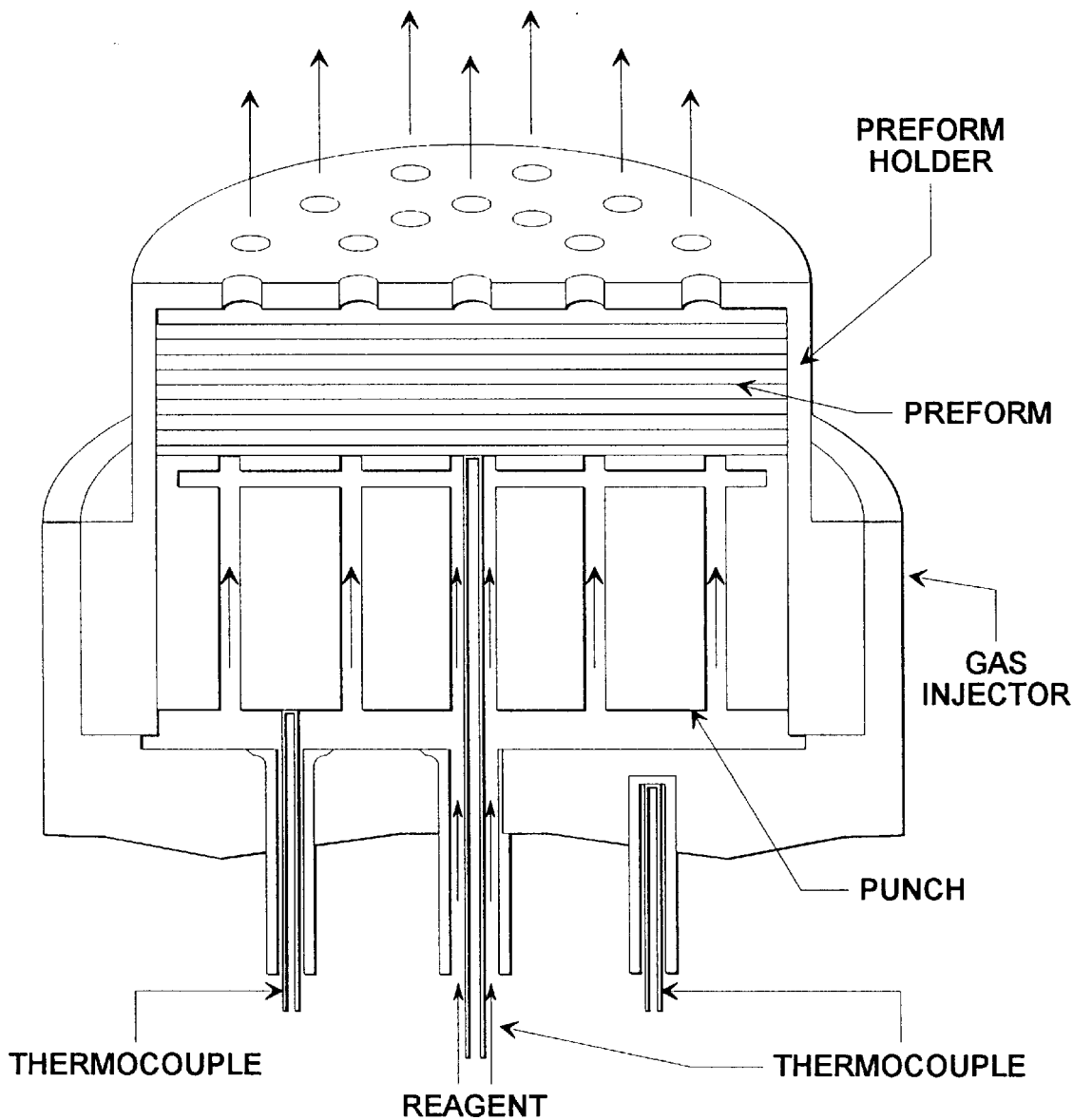
FIG. 1 is a schematic of the FCVI process.

The furnace is filled with argon to atmospheric pressure. Following this step, the furnace is heated to the required temperature with argon flowing in the region outside the reaction chamber to protect the heating element. The furnace operates at constant power throughout the infiltration run. Once the temperature stabilizes within a range of about 400–2000° C., preferably between 600–1400° C., and most preferably between 850–1300° C. (generally approximately 15 minutes), the reagent gas plus diluent is forced through the preform. The flow rates are controlled using mass flow controllers. The pressure above the preform is atmospheric and the pressure in the reagent supply line is approximately 3.4 KPa (0.5 psi) above atmospheric pressure at the beginning of the run. This pressure gradient forces the reagent through the preform. The reagent gas first contacts the cooler side of the preform and then flows up through the preform to the hot side. As the infiltration progresses, the back pressure increases as the pores in the preform fill with the deposited matrix. The infiltration process is terminated once the back pressure increases to about 142 KPa (6 psig). After cooling to room temperature, the infiltrated composite is removed intact from the graphite preform holder. Tables 2–4 summarize the operating conditions for the different example runs.

The fiber content and the initial porosity of the preform are obtained from the fiber mass and known fiber density of 1.77 g/cm$^3$. The apparent volume of the composite is measured using Archimedes' principle with methanol. The sample also is weighed after saturating with methanol to permit calculation of the open pore volume. These two values are added to obtain the bulk volume of the composite. As a check on the bulk volume, the above procedure is repeated using water. The density of the deposited matrix is assumed to be 1.9 g/cm$^3$ in order to permit the calculation of the total porosity. Changing the assumed matrix density from 1.8 to 2.1 g/cm$^3$ changes the value of the total porosity at most by only 3%. Densities in the range of 1.9 to 2.0 g/cm$^3$ are typically observed for CVI Carbon. S. H. Oh and J. Y. Lee, Carbon, 26, 763–768 (1988).

The first step in designing the process is to identify the independent variables. There are three independent variables which affect the infiltration process significantly: the temperature of the bottom of the preform; propylene concentration; and total gas flow rate. Table 5 gives the high and low values for each of the independent variables using a $2^3$ factorial experiment with replication of the center point. Tables 2–4 list the details of the processing conditions for each run. Experiments are typically identified (second column in Table 4) by the level of a factor in that experiment. "TC" refers to the experiment conducted with variable T (temperature) and C (propylene concentration) at the high value and the variable Q (total flow rate) at its low value. The notation "(1)" refers to all variables at their low value.

The temperature of the bottom of the preform varies significantly from the desired temperature for many of the examples undertaken. Hence, a time averaged temperature is employed for the analysis of the data. Table 4 summarizes this averaged temperature for each infiltration run. Process variables, other than the three being studied, are held constant during the statistical study. Total pressure above the preform is kept constant at 1 atm for all experiments. Each run is terminated once the back pressure reaches 142 kPa for the standardized flow.

The response variables for the infiltration process are chosen based on the process and product requirements and include infiltration time, final porosity, rate of weight gain and the uniformity of densification. The uniformity of densification is estimated from the average deposition rate at a given position within the composite. Ideally, one would like to reduce the infiltration time and final porosity. At the same time the infiltrated composite should be uniformly dense independent of the position within the composite.

2. Analysis

One method prevalently used to analyze unbalanced designs, such as that used here, is regression as shown by J. Neter, W. Wasserman, and M. H. Kutner, Applied Linear Regression Models, 2nd ed., Irwin, Boston, Mass. (1989). The main concern when using regression is choosing the appropriate variables. In overzealousness to better fit the response surface, one might add some variables which do not have any relationship to the response variable. One way of overcoming this limitation is to use the "all possible-regression selection procedure". In this approach the response is regressed against all possible independent variables and their interactions. From this set, a few "good" models are chosen based on some criterion. These models are in turn examined in detail leading to the selection of the final regression model to be employed. The following are some of the most common criteria for comparing different regression models:

$R_{p2}$ criterion: This value is defined by the following:

$$R_p^2 = \frac{SSR_p}{SSTO} = 1 - \frac{SSE_p}{SSTO} \qquad (1)$$

Where, SSTO is the total sum of squares of the response, $SSR_p$ is the sum of squares due to regression, and $SSE_p$ is the error sum of squares. This value gives an estimate of the amount of variation observed for the response that can be explained by the regression. For example, a value of 75% indicates that 75% of the variation of the experimental data is explained by that particular regression.

The error sum of squares will always reduce as more variables are added to the equation. Hence, the value of the $R_p^2$ will always increase with the addition of new variables. This value can be used to ascertain the point where addition of new variables does not lead to a drastic change.

$R_{a2}$ criterion: This is the adjusted coefficient of multiple regression which takes the number of independent variables into account. The value of $R_a^2$ can be found using equation (2).

$$R_a^2 = 1 - \left(\frac{n-1}{n-p}\right)(1 - R_p^2). \qquad (2)$$

Where, n is the number of data points and p-1 gives the number of independent variables in the equation. The value of $R_a^2$ does not always increase with the addition of new independent variables. Thus, one can find the "best" subset of regression by finding the equation that yields the maximum $R_a^2$ value.

$C_p$ Criterion: This is concerned with the "total mean squared error" of the n fitted values for each regression model. The $C_p$ values for different regression models are plotted against the value of p for the model. Models whose $C_p$ value falls near the line $C_p=p$ are preferable since they have minimum bias. Where bias is defined as the difference between the predicted value with the regression and the mean of the response variable.

t-ratio: It is defined as the ratio of the value of the coefficient in the regression equation to the standard deviation of the same. If the value of the t-ratio is greater than 2.0 then the effect of the variable is considered significant.

The above criteria were based on the regression model. It is also important to find the influence of a given data point on the regression especially for cases with a limited number of data points. In the following paragraph the parameter used to find the influence of a given data point is explained.

Influence of fitted values (DFFITS): This also gives a measure of the influence of a particular point on the fitted regression. It is defined as $$(DFFITS)_i = \frac{\hat{Y}_i - \hat{Y}_{i(i)}}{\sqrt{MSE_{(i)} h_{ii}}} \qquad (3)$$

Where $Y_i$ is the fitted value of the ith case when all n cases are used to fit the regression and $Y_{i(i)}$ is the fitted value for the ith case when ith case is omitted in fitting the regression.

3. Results

Table 6 lists the infiltration time, rate of weight gain, porosity, density and deposition efficiency for 15 FCVI example runs. All the regressions are done against the coded variables (Table 4) to help in ascertaining the relative effect of changing the independent variable on the response.

The infiltration time is defined as the time taken for the back pressure to reach 142 kPa (6 psig) for a feed of 100 $cm^3$/min each of propylene and hydrogen during the densification. The longest time (28.5 hours) taken is where all the variables are kept at their low level. The infiltration time is reduced to less than 3 hours when all the variables are at their high values. The infiltration time is regressed against different sets of independent variables and second order interactions. The resulting regression is given below:

Infiltration Time=$10.3-3.66T_{cod}-5.43C_{cod}+2.26T_{cod}*C_{cod}$
$S_{regression}=3.455\ R_p^2=80.3\%\ R_a^2=74.9$ \qquad (4)

The above regression equation shows satisfactory fit to the experimental data. However, when the residuals are plotted against the predicted value the graph shows a trend. In an ideal case the residuals must be random with respect to the predicted values. The presence of a trend in residual plots suggests curvilinear effects in the response and a simple linear regression is not adequate to explain the data. The response can be linearized by use of a simple transformation. Also, analysis of the data indicates that the DFITS value for the experiment (1) was 2.52. This implies that this data point is an outlier. However, there are no experimental reasons to delete this point from the regression equation. The transformation will also help in reducing the influence of this point on the regression equation.

The Box-Cox standard transformation criteria is employed in choosing the transformation. G. E. P. Box and D. R. Cox, J. Royal Stat. Soc. B., 26, 211 (1964). This criteria is based on reducing the error sum of squares.

In the case of infiltration time the natural logarithm transformation of the response variable is the most appropriate one. This transformed variable is regressed against the coded variables and the following regression equation is the best fit of the experimental data.

$Ln$(Infiltration time)=$2.11-0.359T_{cod}-0.541C_{cod}-0.245Q_{cod}$
$S_{regression}=0.2155h,\ R_p^2=91.7\%,\ R_a^2=89.5\%$ \qquad (5)

The main effects have a significant effect on the infiltration time. As temperature, propylene concentration, and total flow rate are increased, the time required for densification decreases (Table 6). Concentration has the most influence on the infiltration time followed by temperature and flow rate respectively. The interactions between the independent variables are negligible. The $C_p$ value is below 4 which indicates little bias.

The rate of weight gain is much higher when propylene or propane is used as the reagent compared to methane at similar flow conditions. The rate of weight gain is 0.7–1.1 g/h for runs with 50% propylene (PCVI-8,9). when the concentration of the propylene is reduced to 25% (PCVI-6) the rate of weight gain also reduced to 0.36 g/h. The rate of weight gain is 0.88 g/h for the case of 50% propane (PACVI-16). For methane runs the rate of weight gain is 0.25 g/h for 50% concentration (MCVI-11) and 0.16 g/h for 25% concentration (MCVI-7). The rate of weight gain is much lower for methane than for propylene or propane, even though the methane runs are carried out at much higher temperatures. This can be explained by the higher stability of the radicals produced by methane pyrolysis compared to propylene or propane.

It is anticipated that satisfactory results will be obtained using a hydrocarbon reagent concentration of between 5–90%, preferably between 10–75%. Experimental results show very rapid uniform infiltration at a hydrocarbon reagent concentration of between 25–50%.

It is anticipated that a total flow rate (reagent plus diluent) of 10–5000 cc/minute will provide acceptable results for a preform having a diameter of 1⅞ inches (2.76 sq. inches) and a thickness of approximately 0.3 inches. A preferred range of flow rate is 50–1000 cc/minute. Experimental results have given very good results at flow rates between 100–400 cc/minute. If thicker preforms, or preforms having fibers of other dimensions, such that the surface area available for deposition varies, then the flow rate would have to be scaled accordingly.

The overall weight gain is divided by the infiltration time to obtain the rate of weight gain. This parameter is the average deposition rate for a particular example. The data are first regressed linearly and equation (6) is obtained.

$$\text{Rate of Weight Gain}=1.55+0.569T_{cod}+0.699C_{cod}+0.421Q_{cod}$$
$$S_{regression}=0.4966 g/h, R_p^2=81.6\% \ R_a^2=76.6\% \quad (6)$$

In this case too, the plot of residual versus predicted value shows a trend. Also, Cp>>4 indicating high bias in the regression equation. Consequently, the response variable is transformed based on the Box-Cox criteria. The natural logarithm is again found to be the most appropriate transformation. The resulting regression equation which fits the data is given in equation (7).

$$Ln(\text{Rate of Weight Gain})=0.234+0.381T_{cod}+0.503C_{cod}+0.235Q_{cod}$$
$$S_{regression}=0.2287, R_p^2=90.5\%, R_a^2=87.8\% \quad (7)$$

From the above equation it can be seen that the rate of densification is affected only by the main variables, namely, the preform bottom temperature, concentration of the reagent, and the total flow rate; there are no significant interaction terms. If kinetics controlled the reaction, the flow rate would not affect the rate of densification. In the case where mass transfer controls the reaction, the temperature will have minimal effect on the rate of densification. The FCVI process, for the conditions used here, operates in an intermediate regime where both kinetics and mass transfer have an influence on the rate of densification.

Composites with total porosities as low as 7% are densified in 8–12 hours using a propylene concentration of 50% (PCVI-8,9). When the concentration is reduced to 25% (PCVI-6), the final porosity increases to 16–18%. For PCVI-10, use of a thicker preform led to a cooler bottom preform temperature (650° C.) resulting in higher total porosity. Two runs conducted with 10 cloth layers (PCVI-12,13) result in high total porosity when the runs are terminated after 2 hours of infiltration. Composites prepared using methane have a much higher porosity when compared to propylene. For example, the porosity is 17% when a 50% concentration of methane is used, compared to 7% when using the same concentration of propylene. Composites can be densified in a very short time using the FCVI method provided the proper operating conditions are used.

The open porosity of fully infiltrated composites is typically approximately 4%. The closed porosity for propylene runs is approximately 3–5%. For methane, the closed porosity is about 10%. This high value of closed porosity may be because the kinetics of carbon deposition from methane for the specific operating conditions used to prepare sample MCVI-11 result in larger amounts of closed porosity. When the composite contains only 10 cloth layers, the open porosity is approximately 31–37%.

The final total porosity of the composite is calculated assuming the density of the carbon deposit to be 1.9 g/cm$^3$. Changing the assumed value of the matrix density from 1.8–2.1 g/cm$^3$ affects the calculated porosity at most by only 3%. Also, the density of carbon matrix produced by CVI is in the range 1.9–2.1 g/cm$^3$. S. M. Oh and J. Y. Lee, Carbon, 26, 63 (1988); Carbon, 26, 769 (1988); Carbon, 27, 423 (1989). The final porosity is typically 5–10% with the exception of PCVI-31. The open porosity is typically 3–6%.

The density of the composite is found by dividing the weight of the composite by the bulk volume. The bulk density of the composite is typically approximately 1.65 g/cm$^3$. This bulk density is analyzed against the independent variables and their interactions. The density is independent of the preform bottom temperature and flow rate and is only very weakly related to the concentration of the reagent.

The infiltration is stopped once the back pressure reaches a predetermined value. The back pressure is related to the permeability (porosity) across the composite. This back pressure is a measure of the densification; the back pressure is directly related to the final density and can be used to monitor and control the densification of the composite.

Figure 2A:
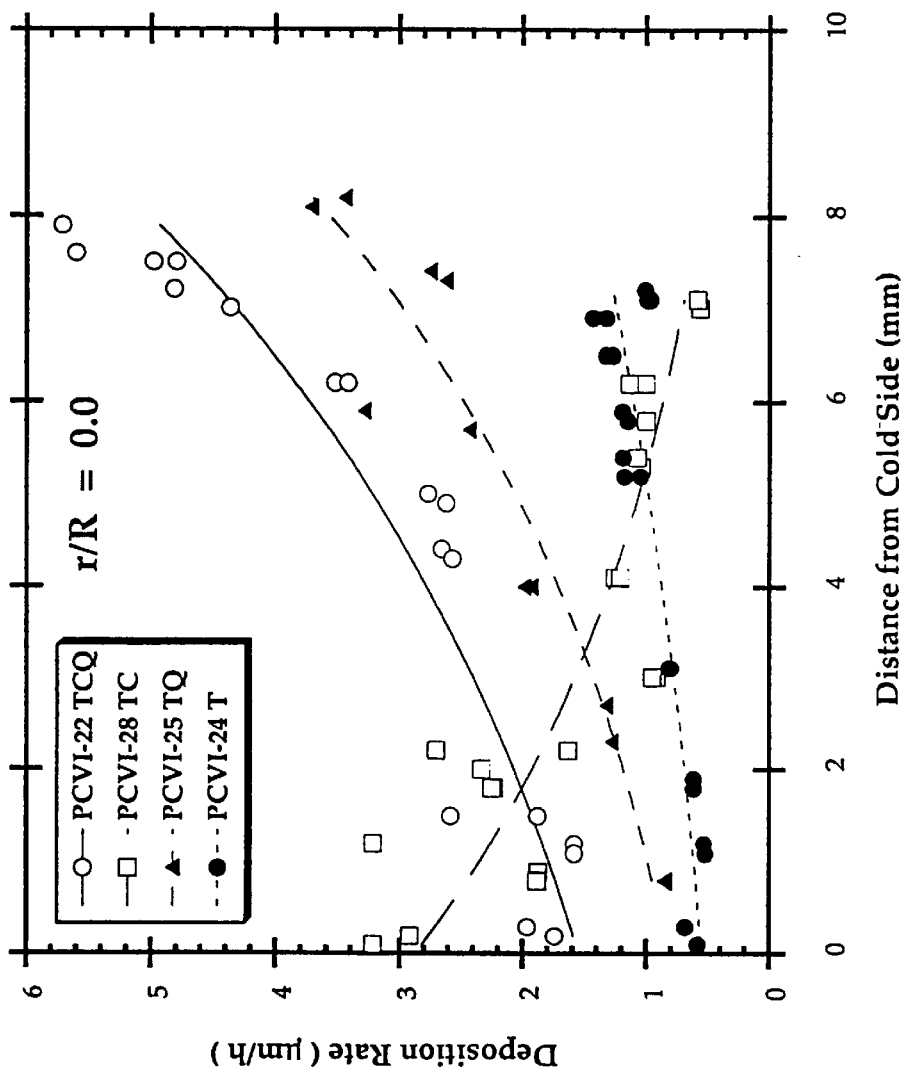
FIG. 2a shows the deposition rates for high value temperature experiments near the center of the composite disk.
Figure 2B:
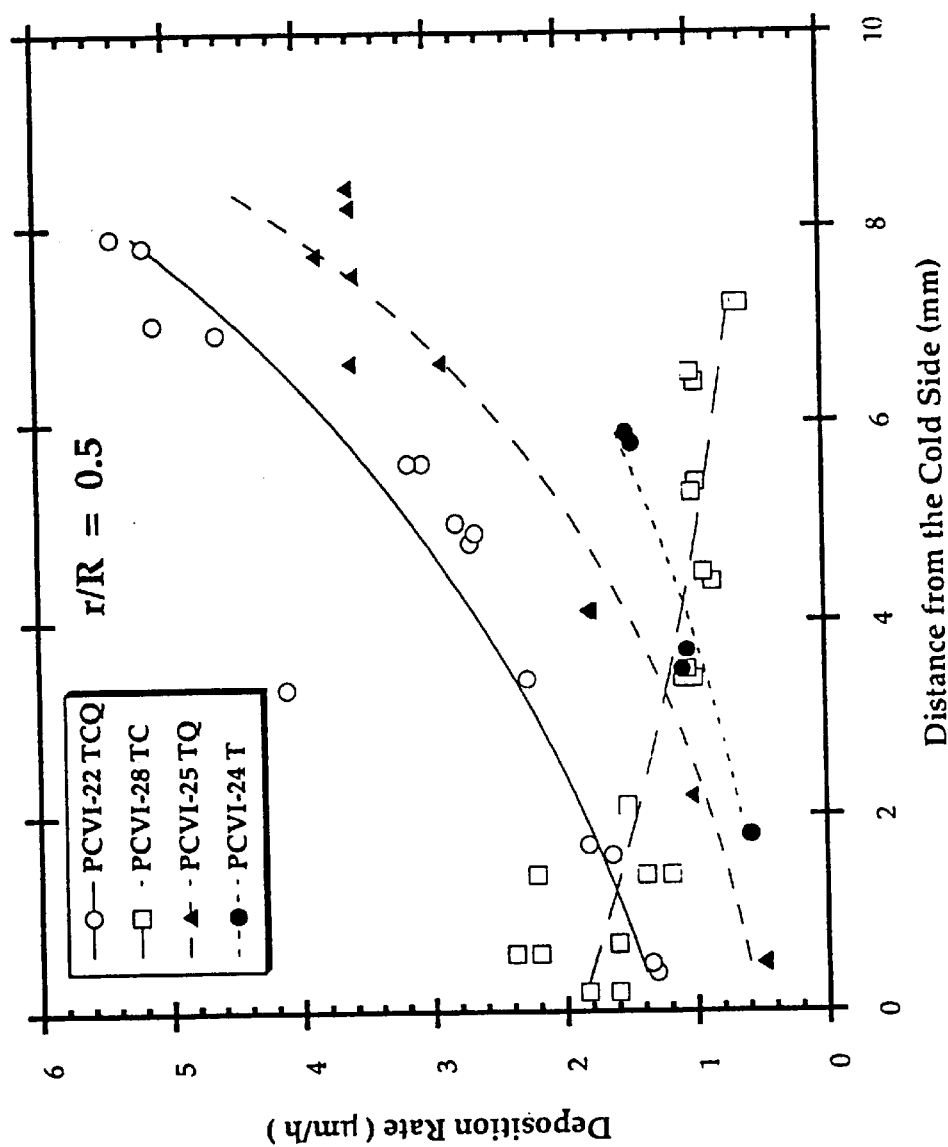
FIG. 2b shows the deposition rates for high value temperature experiments between the circumference and middle of the composite disk.
Figure 2C:
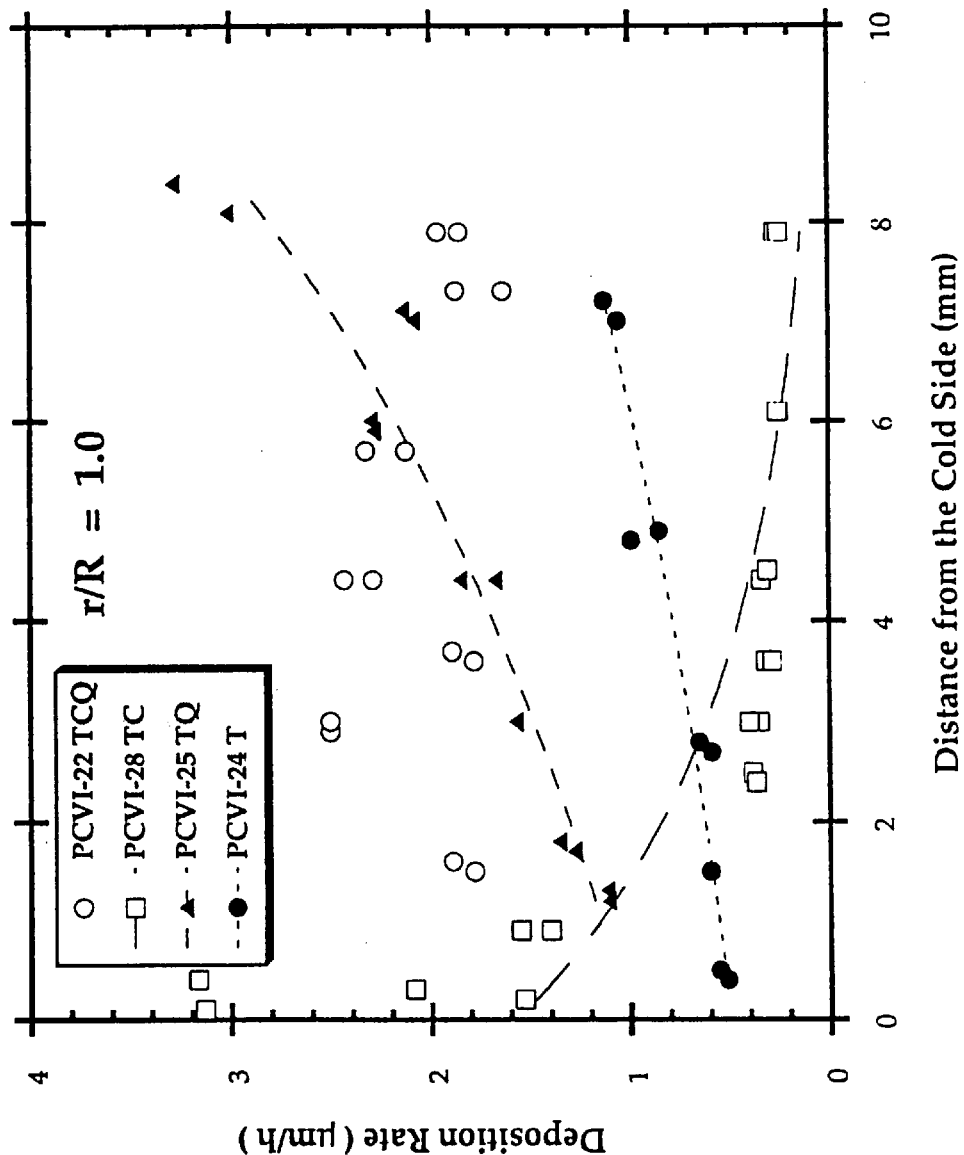
FIG. 2c shows the deposition rates for high value temperature experiments near the circumference of the composite disk.

The density of slices obtained from different parts of composites are used to evaluate the uniformity of densification within the composite. The bulk density in g/cm$^3$ of the slices for different composites are summarized in Table 7. The hot side, middle show similar densities of approximately 1.7 g/cm$^3$ with the exception of the of PCVI-22, 23 and 23. In PCVI-22, high temperatures and concentration near the hot side result in increased porosity within the tow region resulting in reduced density. In the case of PCVI-28 the cold side of the composite densifies faster than the hot side as can be seen from deposition rate data (FIGS. 2a–2c). Hence, the feed does not flow to the hot side of the preform resulting in a porous structure.

The density of the slices from the cold side is 1.4–1.6 g/cm$^3$ which is slightly lower than hot or middle of the composite. This value is only approximately 10% lower than the average bulk density. Uniformly dense composites are obtained over a wide range of conditions with a single cycle of infiltration using the FCVI process. The density of the cold side can be increased, to further improve the uniformity, by changing the operating conditions near the end of the infiltration.

Deposition rate is calculated by dividing the coating thickness by the infiltration time. The deposition rate for macropores is different from that for micropores. The highest deposition rates obtained for macropores are 3.0–3.5 μm/h in the runs with 50% propylene (PCVI 8) and with 50% propane (PACVI-16). This deposition rate is comparable to that obtained for FCVI processing of SiC—SiC composites (A. J. Caputo, R. A. Lowden, and D. P. Stinton, "Improvements in the Fabrication of Ceramic-fiber-ceramic-matrix Composites by Chemical Vapor Infiltration," ORNL/TM-9651, Oak Ridge National Laboratory, Oak Ridge, Tenn. [June 1985]), and is more than an order of magnitude larger than the deposition rates of 0.1–0.25 μm/h for isothermal CVI of carbon or SiC. W. J. Lackey, and T. L. Starr, Fiber Reinforced Ceramic Composites (ed. K. S. Mazdiyansi), pp. 397–449, Noyes Publication, NJ (1991). The deposition rate with 25% propylene (PCVI-6) is 0.6–0.7 μm/h. The deposition rate in macropores with 25% methane (MCVI-7) is approximately 0.5 μm/h.

The deposition rate in micropores is 0.14–0.4 μm/h at 50% propylene concentration (PCVI-8) and 0.05–0.12 μm/h for 25% propylene concentration (PCVI-6). For propane and methane, the deposition rates are 0.07–0.2 μm/h and 0.04–0.08 μm/h (MCVI-7) respectively. The large variation in the value of the deposition rate in micropores for a given processing condition can be attributed to the variations in the fiber spacing.

Figure 3A:
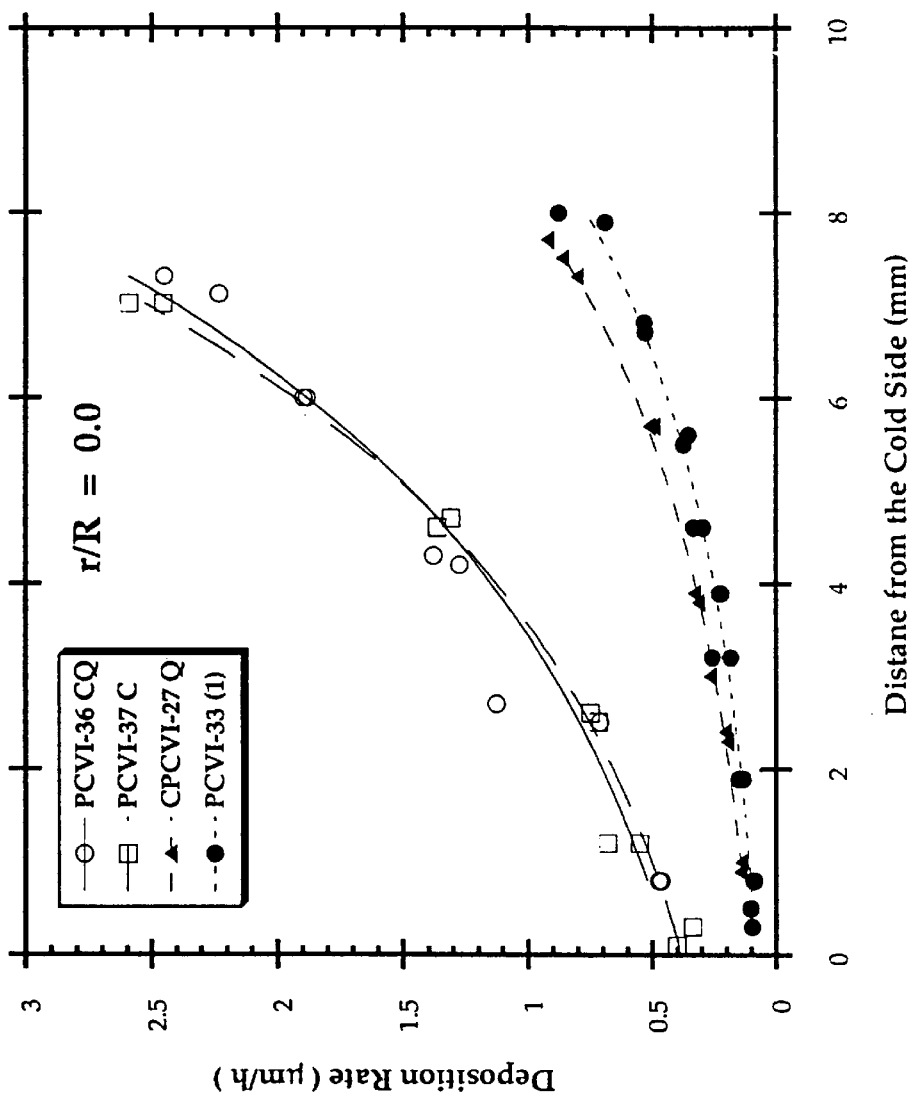
FIG. 3a shows the deposition rates for low value temperature experiments near the center of the composite disk.
Figure 3B:
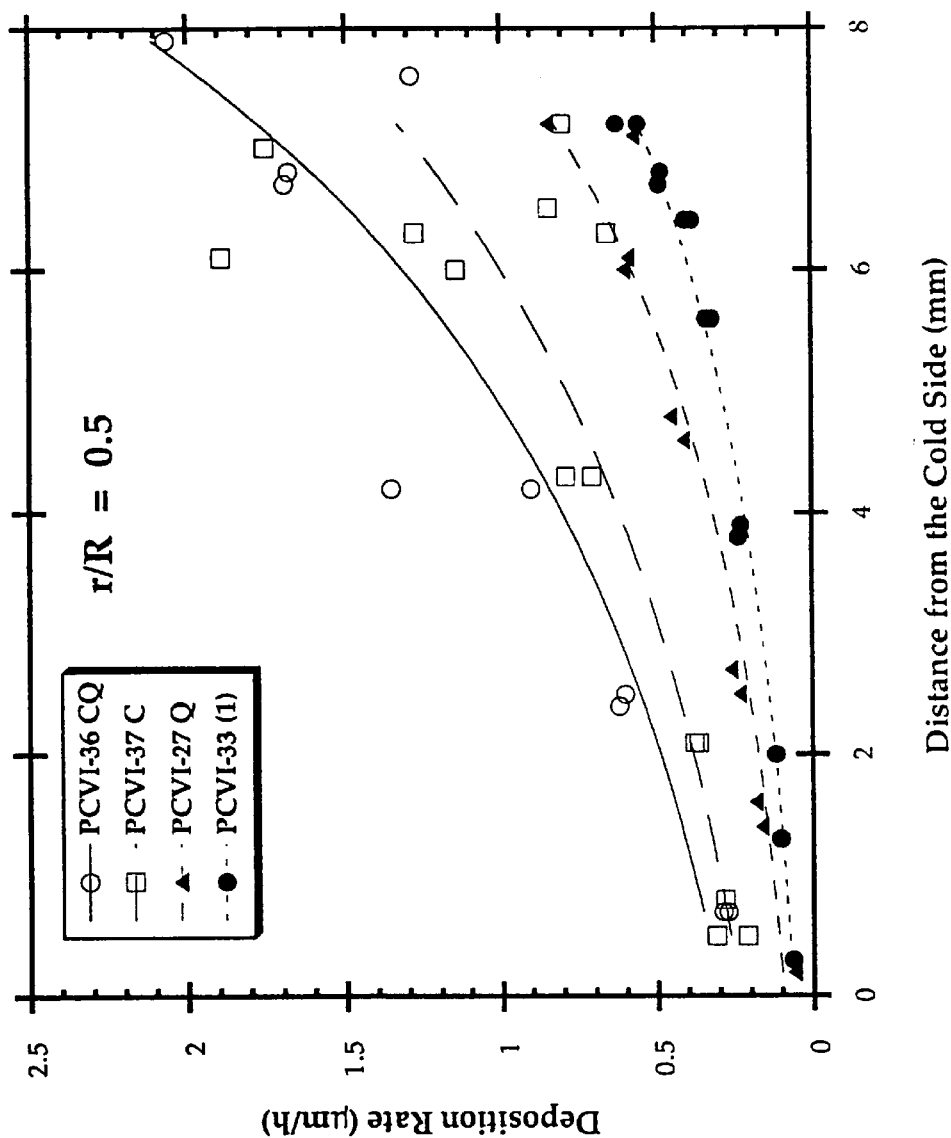
FIG. 3b shows the deposition rates for low value temperature experiments between the circumference and middle of the composite disk.
Figure 3C:
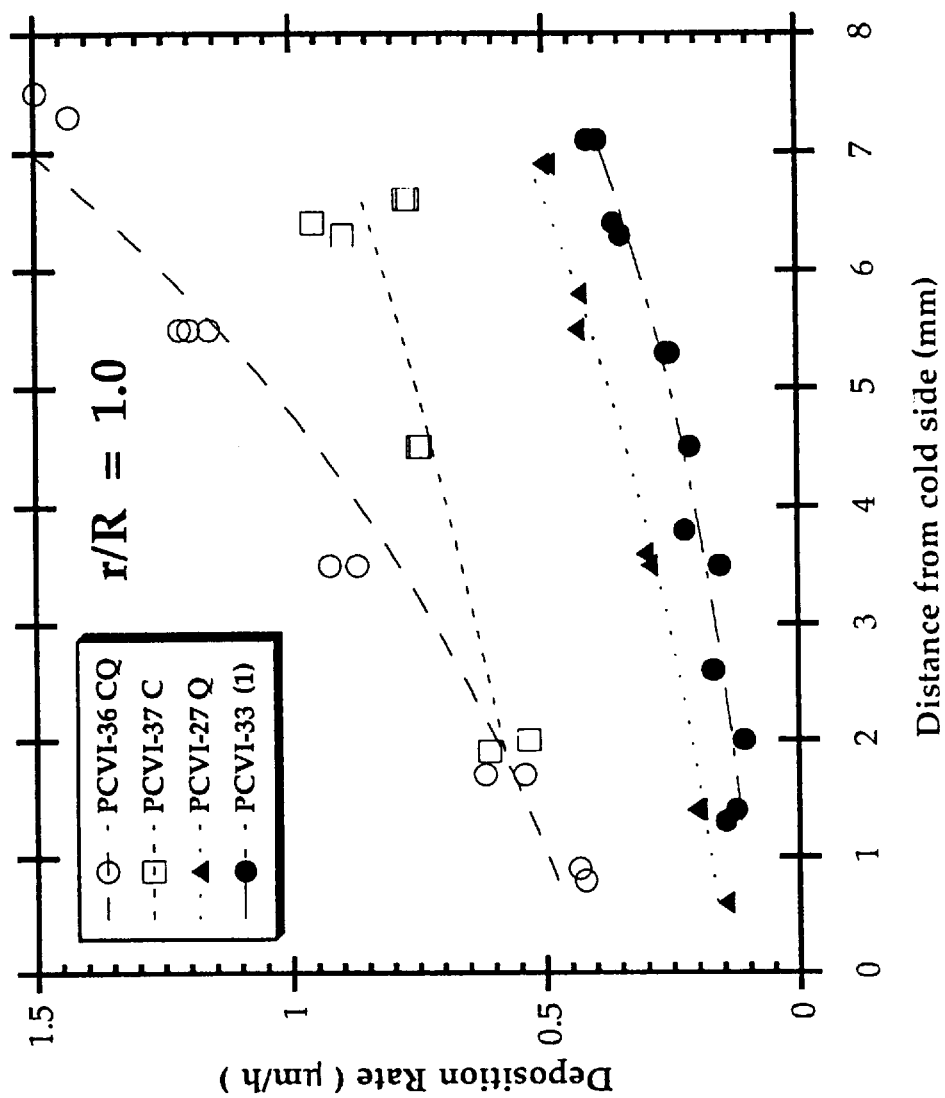
FIG. 3c shows the deposition rates for low value temperature experiments near the circumference of the composite disk.
Figure 4A:
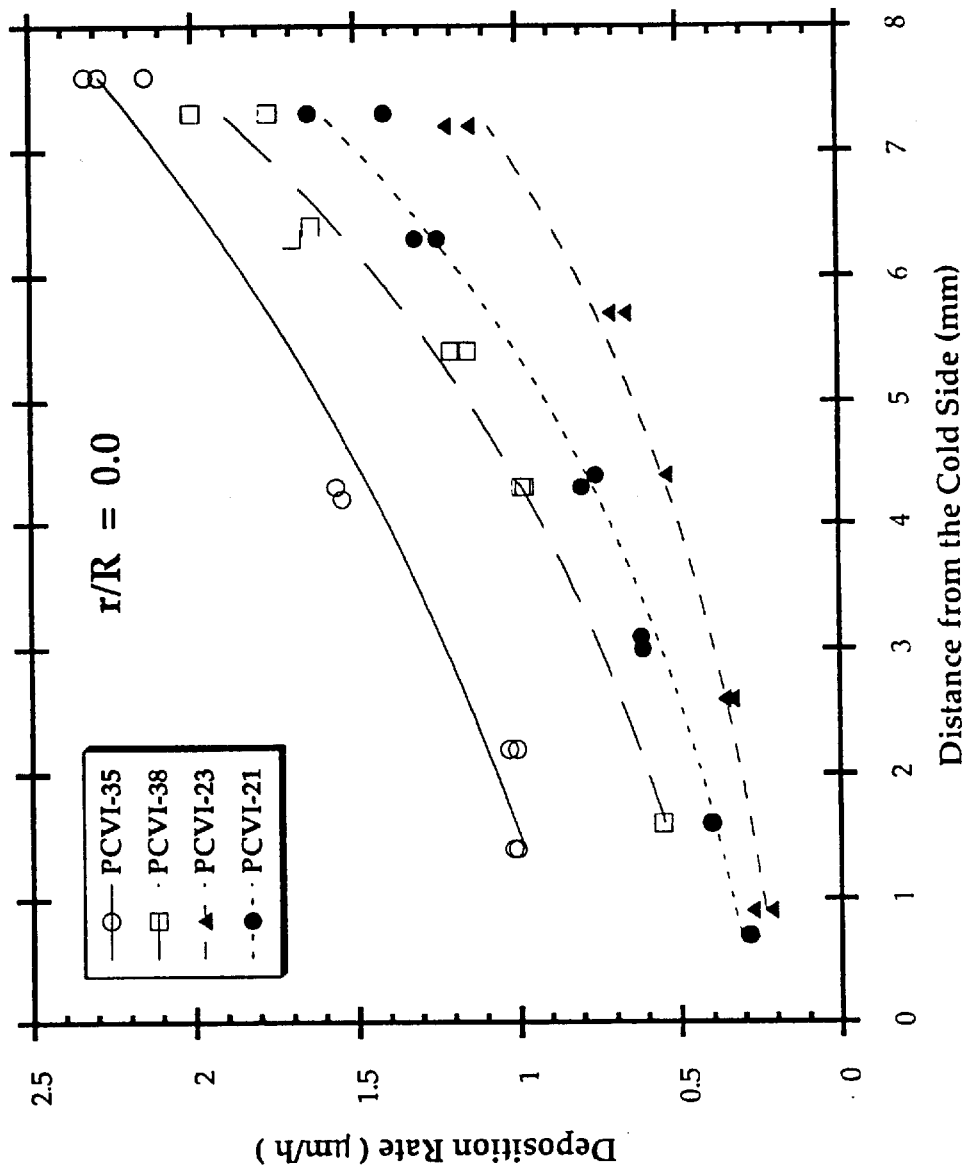
FIG. 4a shows the deposition rates for midpoint experiments near the center of the composite disk.
Figure 4B:
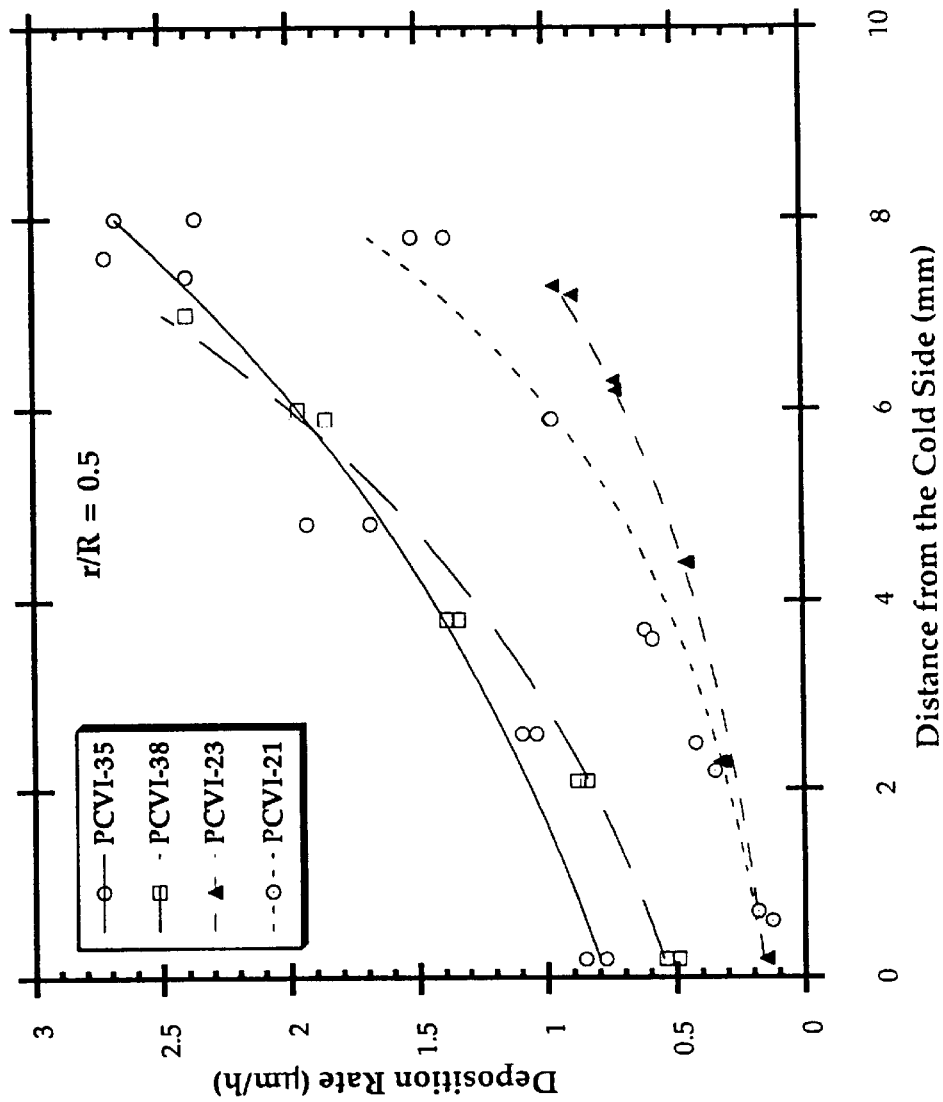
FIG. 4b shows the deposition rates for midpoint experiments between the circumference and middle of the composite disk.
Figure 4C:
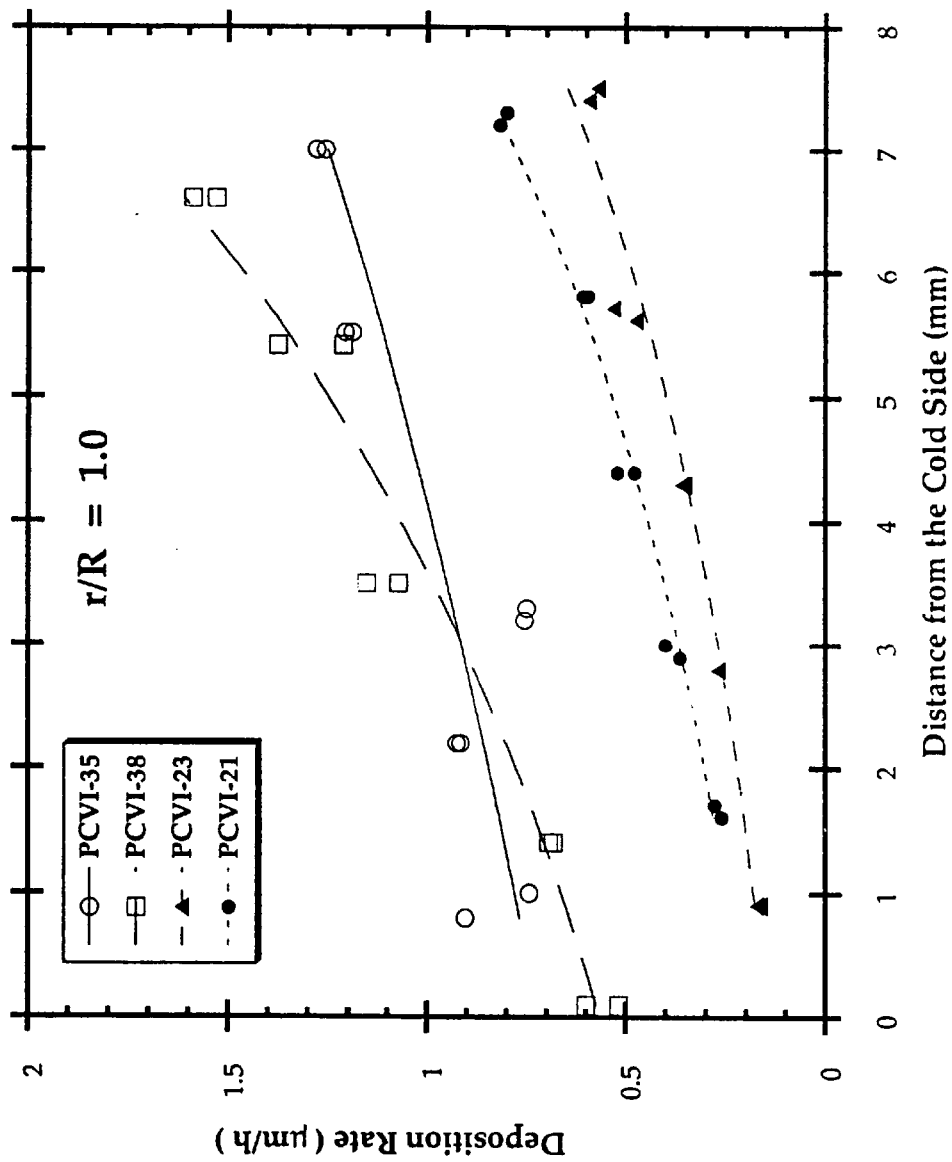
FIG. 4c shows the deposition rates for midpoint experiments near the circumference of the composite disk.

The coating thickness in macropores (pores between cloth layers and between tows in a cloth layer) as a function of position in the composite is measured using a scanning electron microscope. This value is divided by the infiltration time to obtain the average deposition rate. The coating thickness is measured at three radial positions as a function of distance from the cold side of the composite. The resulting deposition rates for different composites are plotted in FIGS. 2–4. The radial position is denoted by the normalized variable 'r/R', where 'r' is the distance from the center of the composite, and 'R' denotes the radius of the composite. An exponential relationship (Table 8) is observed between deposition rate and the distance from the cold side. In all but one run, the deposition rate increases with increasing distance from the cold side and the depletion of reagent does not neutralize the effect of increased temperature. Run PCVI-28 (TC) is the exception to the above behavior. For this run, the coating thickness is much higher near the colder side than the hot side. This is attributable to the high residence time (low flow rates) and high temperatures resulting in higher reagent conversion near the cold surface. Consequently, the reagent concentration profile is different in this run as compared to other runs. Hence, this run is not included in the following analysis.

The equation of the line fitting the deposition rate to distance from the cold side of the preform is used to calculate the ratio of the deposition rate at the hot side to that at the cold side.

$$\Phi = \frac{\text{Deposition rate at hotside}}{\text{Deposition rate at coldside}} \approx \text{Exp}(a*z) \tag{8}$$

Where 'a' is the coefficient of the exponential factor in the regression equation (Table 8), and 'z' is the distance from the cold side. The average thickness of the composites is approximately 7.5 mm. This value is used for calculating the uniformity factor for different experiments. The uniformity values are regressed against the process variables. The resulting equation at different radial positions is summarized below.

at $r/R = 0.0$ (9)

$\Phi = 4.61 - 1.58 T_{cod}$ $S_{regression} = 1.402, \ R_p^2 = 60.4\%, \ R_a^2 = 56.0\%$ at $r/R = 0.5$ (10)

$\Phi = 5.62 - 1.37 T_{cod} - 1.73 C_{cod}$ $S_{regression} = 1.572, \ R_p^2 = 58.0\% \ R_a^2 = 47.5\%$ at $r/R = 1.0$ (11)

$\Phi = 2.48 - 1.03 T_{cod} - 0.986 C_{cod}$ $S_{regression} = 1.572, \ R_p^2 = 58.0\% \ R_a^2 = 47.5\%$ One interesting feature is the value to the intercept at different positions. For r/R values of 0 and 0.5 the uniformity is about 5. However, near the circumference of the composite (r/R=1.0) the deposition is much more uniform compared to other positions. This can be explained by the cooling effect of the graphite holder on the edges of the composites. Hence, the temperature gradient near the circumference of the composite would be much lower than at the center line leading to more uniform deposition near the circumference. Even though the deposition rate varies exponentially with distance, the density variation within the composite is not very significant because the majority of the porosity is within the tow. For Nicalon cloth layup, 70% of the porosity is within the tow. Hence, the uniformity of density in a composite is controlled by effective infiltration of the tow. In all the composite samples there is appreciable infiltration of the tow independent of its position within the composite.

The radial variations of deposition rates are estimated at three axial positions: the hot side; the cold side; and at a distance of 4 mm from the cold side. These positions are chosen to ascertain the trend as one moves from the hot side to the cold side.

The ratio of the deposition rate at the center of the composite to the circumference at the same distance from the cold side is determined for estimating radial variation. On regression, the radial uniformity factor near the cold side and at a distance of 4 mm from the cold side is unaffected by the operating conditions. However, the ratio in the hot side is affected by concentration and a two way interaction as shown in equation (12)

$\Phi_r = 1.86 + 0.584 C_{cod} + 0.363 T_{cod} * Q_{cod} S_{regression} = 0.5071, \ R_p^2 = 61.8\%$
$R_a^2 = 52.2\%$ (12)

Figure 5:
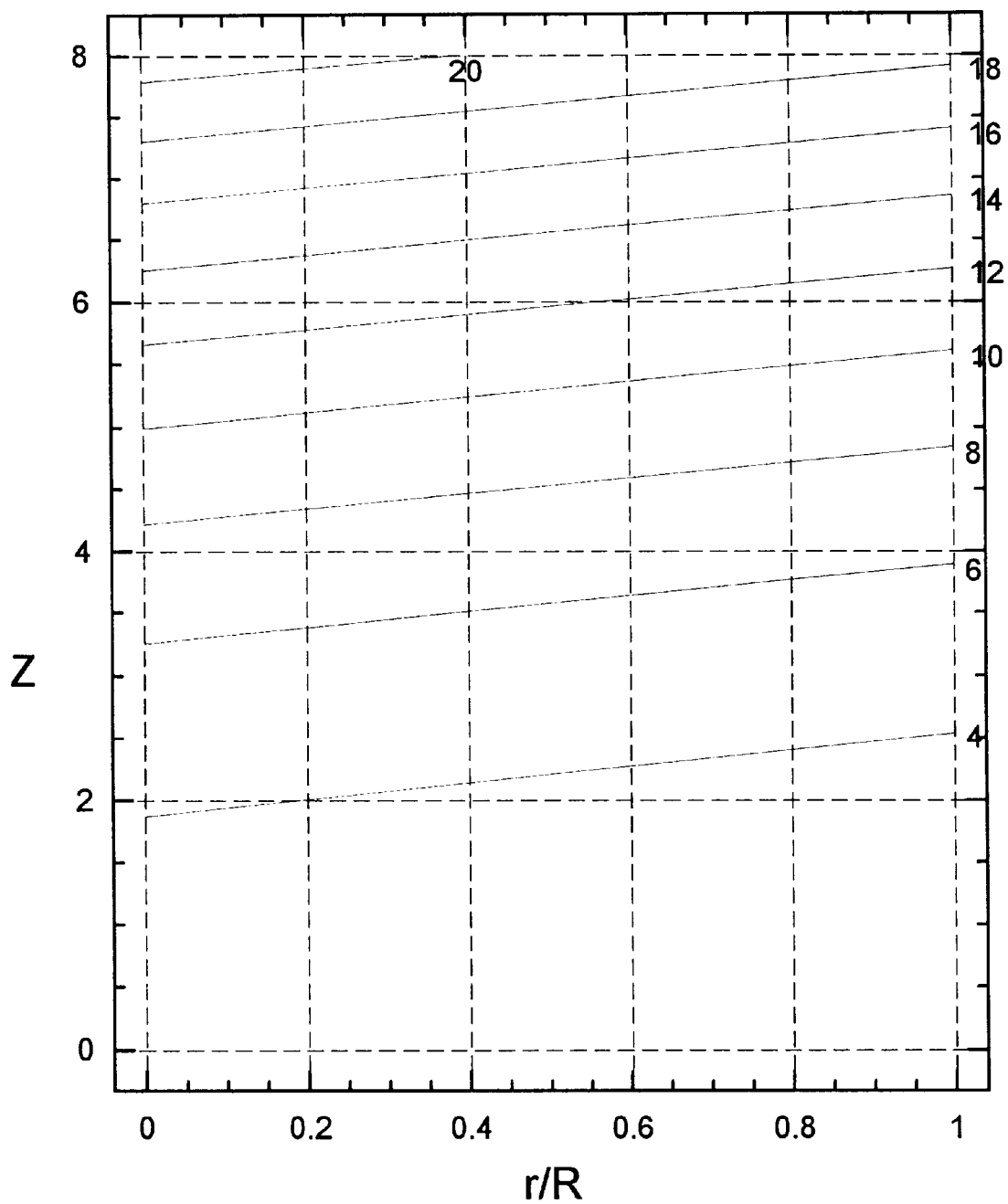
FIG. 5 shows the coating thickness for PCVI-33 as a function of radial position and axial distance. Contour lines were obtained by regressing the data (eqn 13).

The above observation can be explained by the heat flow characteristics in the system. From FIG. 1 it can be seen that near the cold side, the preform is cooled at the circumference by the holder and the bottom is cooled by the graphite punch. This results in reduction of the radial temperature gradient when moving from the hot side to the cold side of the composite. This in turn leads to more uniform deposition rate radially near the cold side. This radial and axial effect for a typical sample (PCVI-33) is depicted in FIG. 5. The contour lines shown in the figure are obtained from a polynomial fit of the axial and radial positions to the coating thickness.

Coating Thickness$(t) = 3.00 + 0.2803z - 0.6252(r/R)*z$ (13)

Where 't' is coating thickness in $\mu$m, and 'r/R' and 'z' are as previously defined.

The deposition efficiency is defined as the ratio of amount of carbon deposited in the preform to the carbon in the feed. It is a measure of the amount of carbon in the feed used for deposition. In the present process, the deposition efficiency is between 5–20% depending on the operating conditions. The deposition efficiency with propylene is between 7 and 12%. The deposition efficiency with methane is 10–15%. This is much higher than 0.5–1.5% reported for the isothermal chemical vapor infiltration process. The only reported value for the deposition efficiency for an isothermal process was only 0.8–1.5% at 700° C. S. Marinkovic and S. Dimitrijevic, Carbon, 23, 691–95 (1985)

Figure 13:
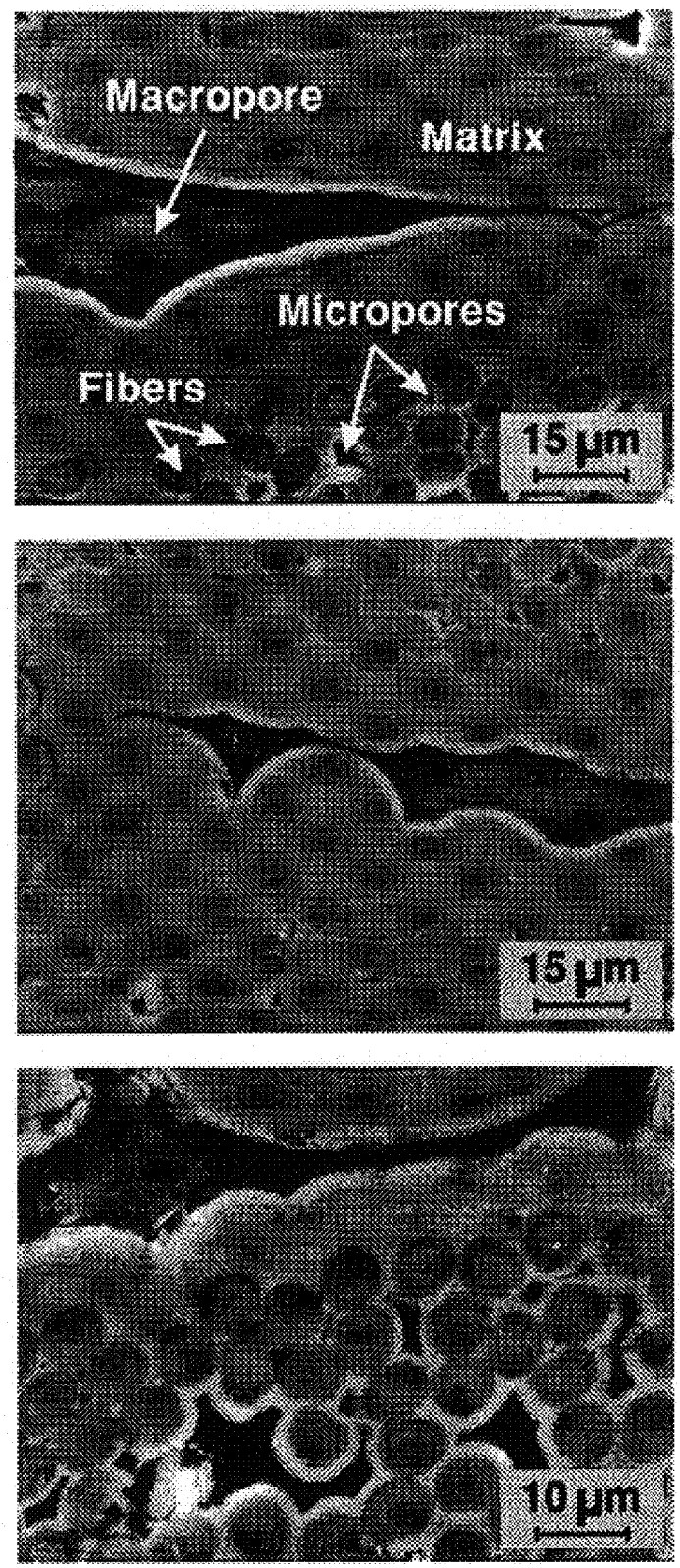
FIG. 13a shows a micrograph of a polished section of the hot side of the composite densified using 50% propylene (PCVI-8).
FIG. 13b shows a micrograph of a polished section of the middle side of the composite densified using 50% propylene (PCVI-8).
FIG. 13c shows micrograph of a polished section of the cold side of the composite densified using 50% propylene (PCVI-8).
Figure 14:
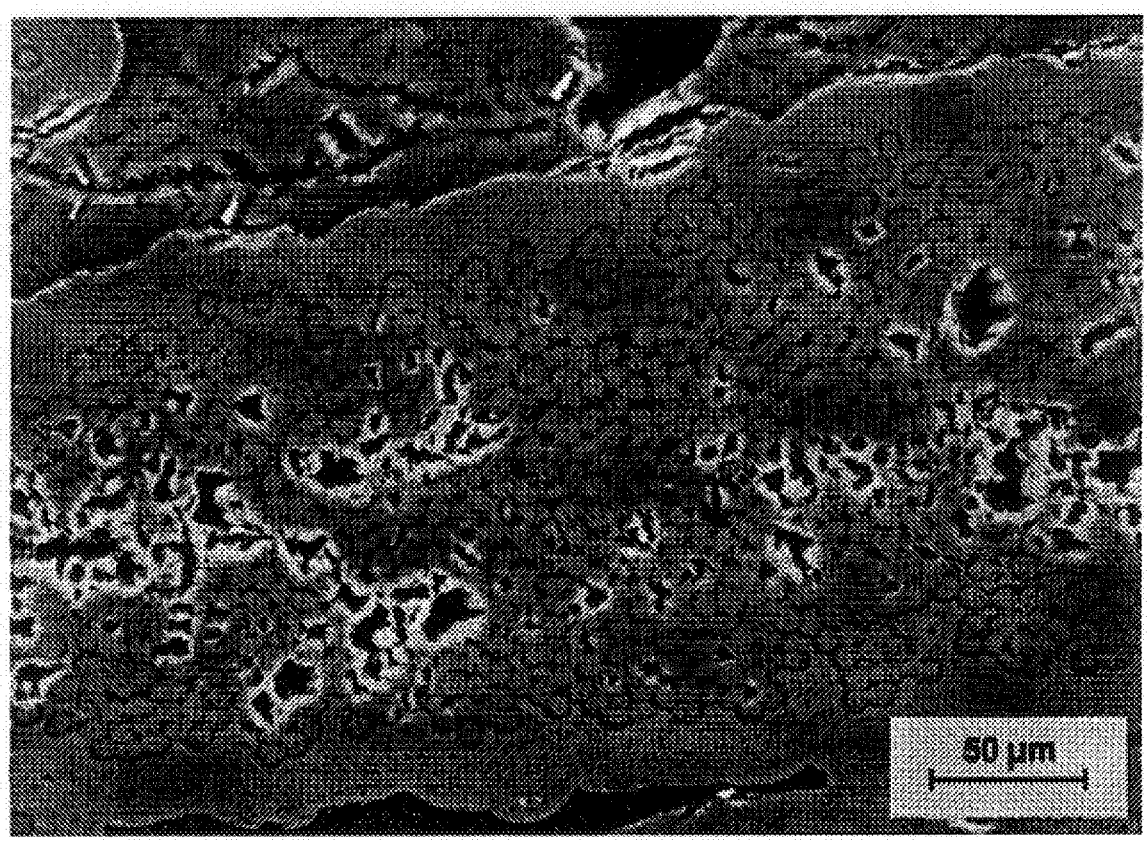
FIG. 14 shows a micrograph from the center of the composite densified using 25% propylene (PCVI-6).
Figure 15:
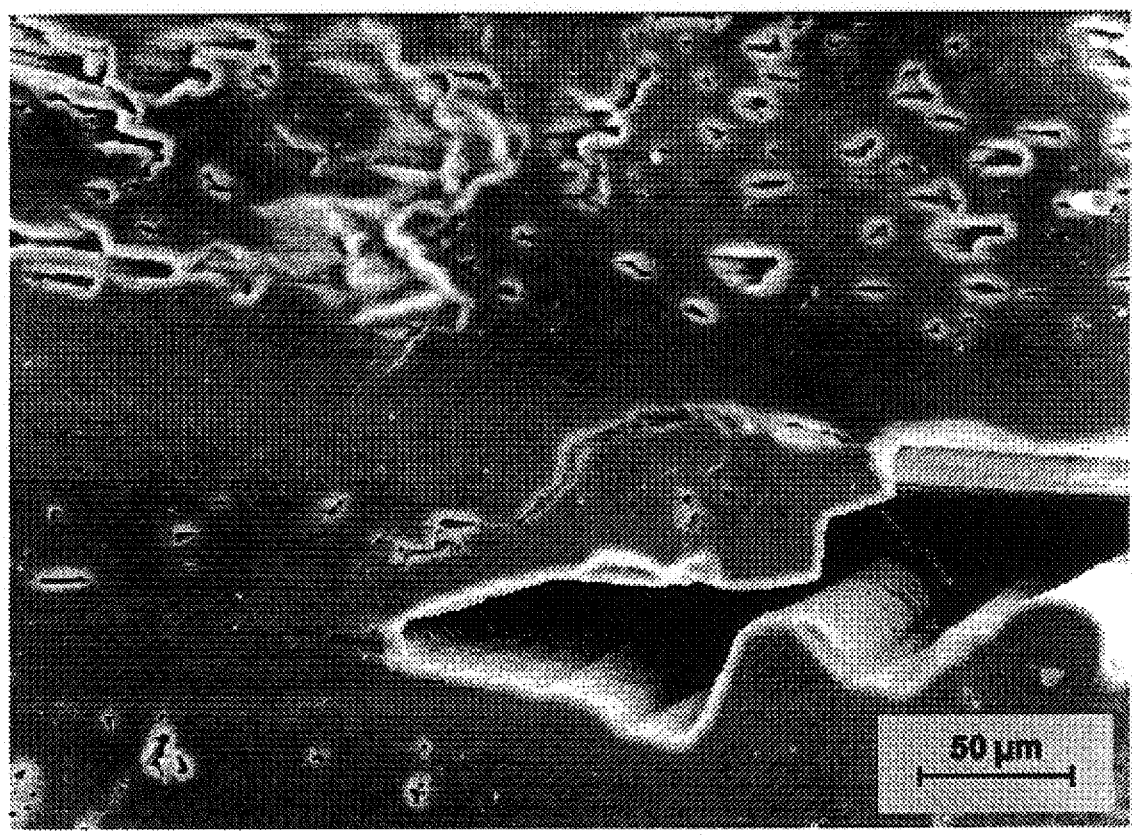
FIG. 15 is a micrograph of the composite densified using 25% methane (MCVI-7).

FIGS. 13(a)–(c) show scanning electron micrographs of the hot, middle, and cold side of the composite from run PCVI-8, respectively. Very little difference in densification is evident for the three locations. Even when the concentration of propylene is reduced to 25%, extensive and apparently uniform densification is obtained (FIG. 14). However, the pores remaining between the cloth layers were larger in this case compared to PCVI-8 since less carbon was deposited. The densification is uniform and appreciable when methane, instead of propylene, is used as the reagent (FIG. 15). This particular micrograph shows how, during the infiltration process, coating of individual fibers creates the matrix. FCVI process is well suited for fabricating carbon-carbon composites because uniform and thorough densification is achieved over a wide range of operating conditions without any detailed optimization of the process.

Figure 6:
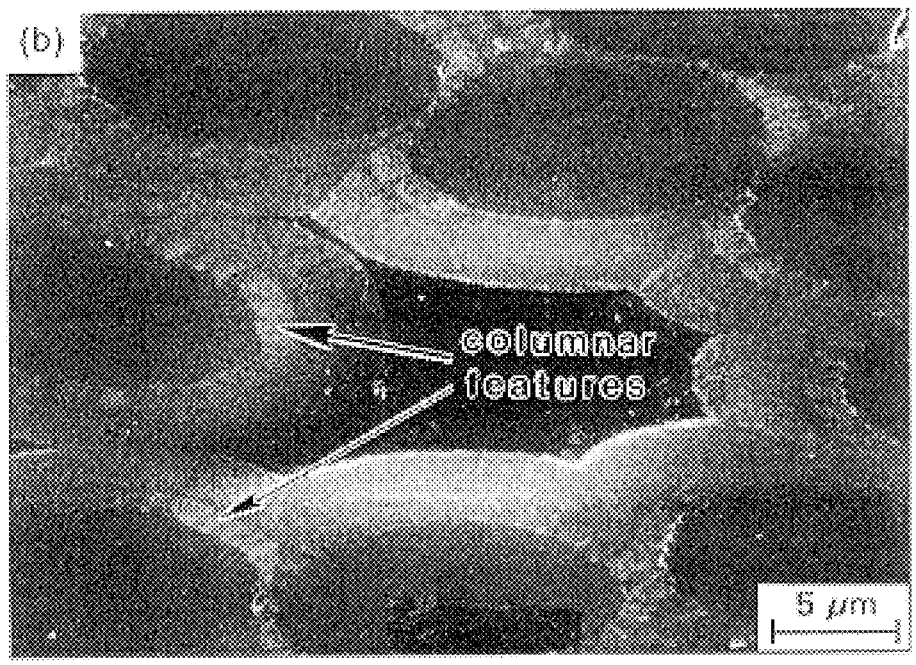
FIG. 6 is a micrograph from the hot side of the composite showing the layered structure and faceted matrix (PCVI-36).
Figure 7:
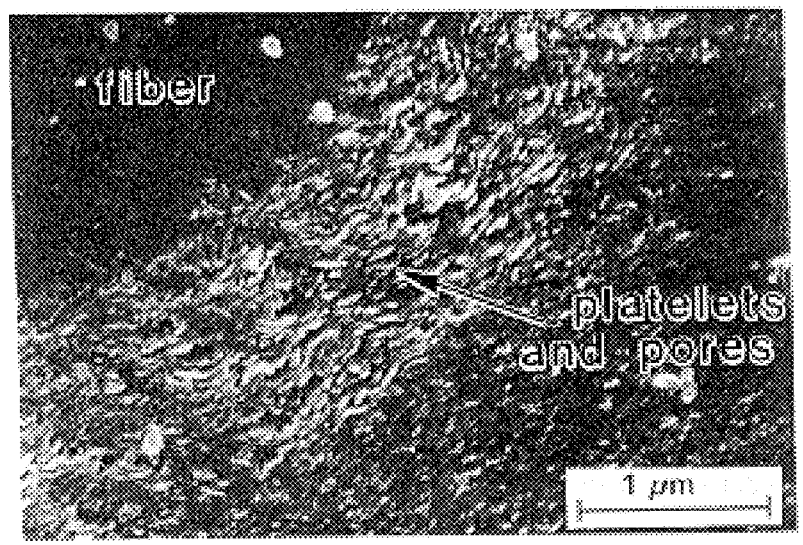
FIG. 7 is a micrograph showing the difference in porosity in layered structure (PCVI-24).

The infiltrated composites are characterized using scanning electron microscopy. Interesting microstructures are observed near the hot side of the composites. Some of the typical microstructures are shown in FIGS. 6 and 7. FIG. 6 shows the layered structure observed near the fibers. Faceting is also observed near the hot side of many of the composites. On closer examination of the layered structure (FIG. 7), it can be seen that the microstructure of the deposit drastically changes showing a sharp interface.

Figure 17:
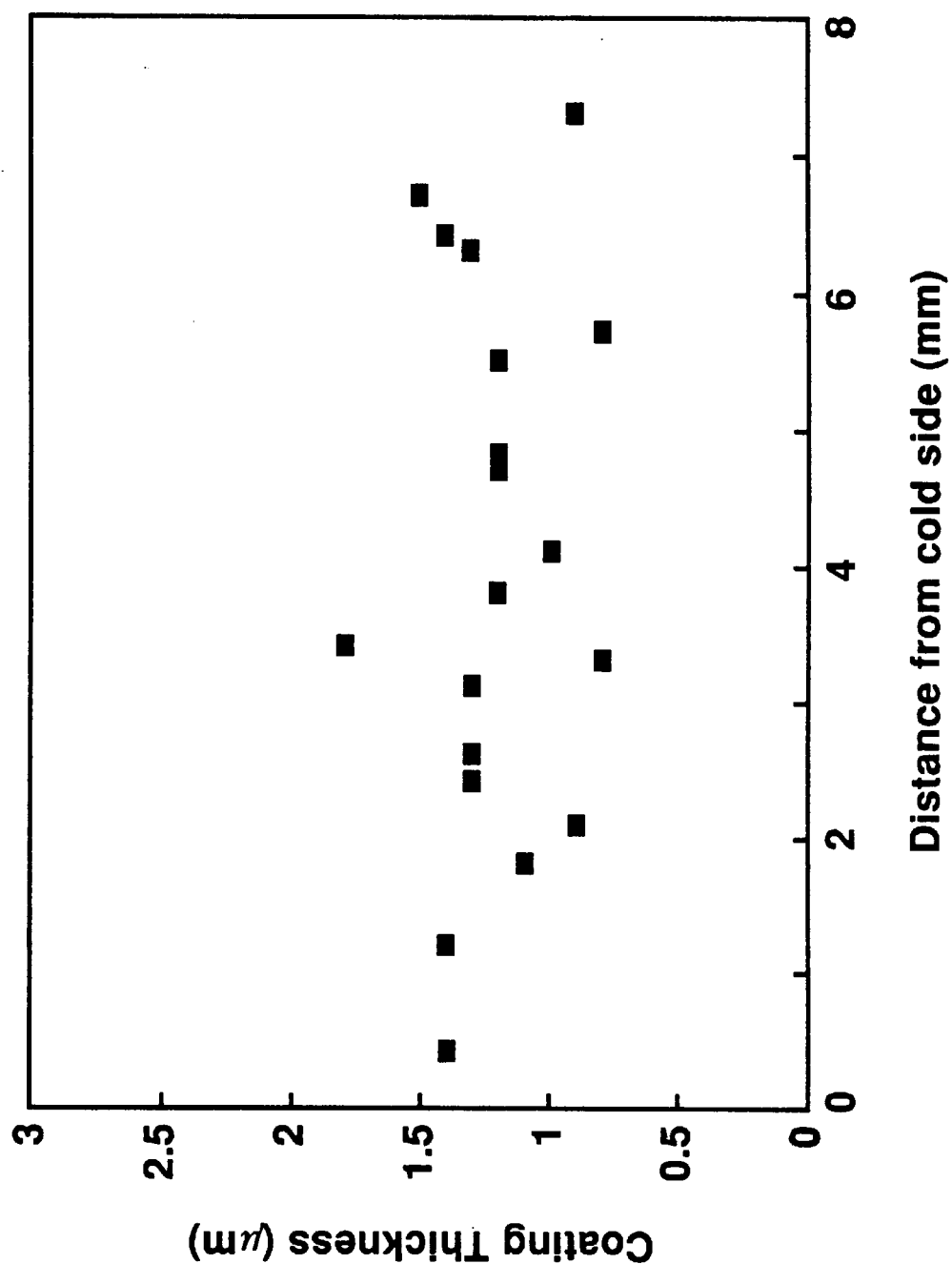
FIG. 17 shows coating thickness in micropores, located inside the tow, as a function of distance from the bottom of the composite.
Figure 18:
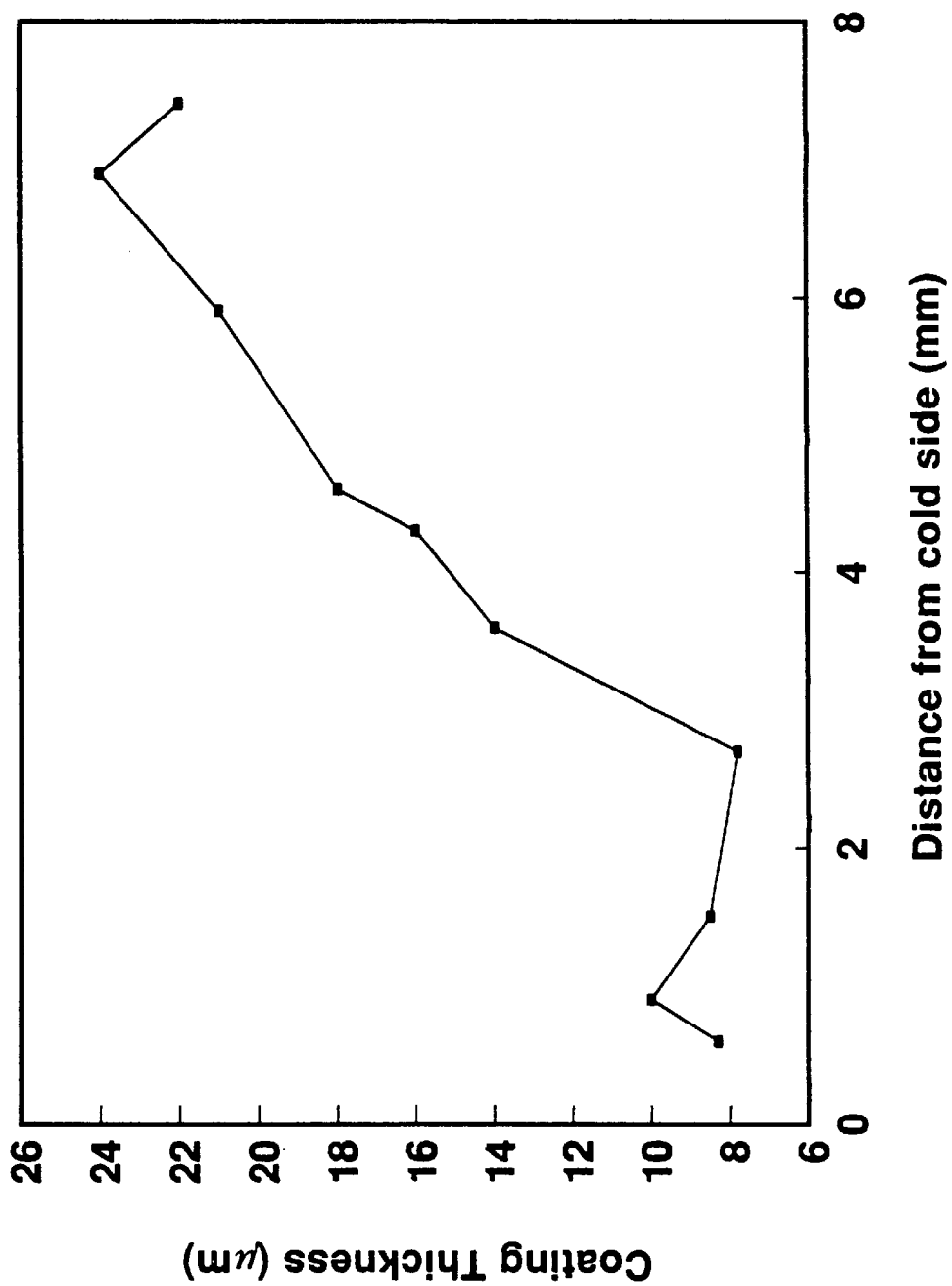
FIG. 18 shows coating thickness in macropores increases with distance from the bottom of the composite.

Using scanning electron microscopy, one can measure the coating thickness in macro and micropores. In a cloth lay-up, macropores are found between the cloth layers and the tows in a cloth, whereas, micropores are found within a tow in a cloth layer. FIG. 17 shows the coating thickness in micropores as a function of the distance from the cold side of the preform for sample PCVI-8. Coating thickness is independent of position within the composite. The scatter of the data is due to different fiber spacing in the tows resulting in different coating thicknesses. FIG. 18 shows the coating thickness for macropores as a function of distance from the cold side of the preform. Coating thickness increases with increase in distance from the cold side. The coating thickness is about 8 $\mu$m at the cold side compared to 22–24 $\mu$m at the hot side. This trend implies that the depletion of the reagent while flowing through the preform did not fully neutralize the effect due to the temperature gradient in the preform for the specific processing conditions used to prepare this sample. The highest coating thickness is only 3 times more than the minimum value. This is considerably less variation than that observed for the isothermal CVI process. This suggests that there may be potential to tailor the concentration to get uniform macropore coating thickness across the preform with the FCVI process.

The deposition rate data obtained by measuring coating thickness is used to obtain a first order rate constant. The carbon deposition from hydrocarbon is typically first order to the concentration of the reagent. P. A. Tesner, in *Chemistry and Physics of Carbon,* edited by P. A. Thrower, 19, 65 (1983); P. McAllister, J. F. Hendricks, and E. E. Wolf, *Carbon,* 28, 579 (1990). Hence, the following equation is used to calculate the 'k' value.

$$\text{Deposition Rate } (\mu\text{m/h}) = kP_{propylene} \quad (14)$$

Where, k=reaction rate constant ($\mu$m/h), $P_{propylene}$=Partial pressure of propylene=Y P, where Y=Mole fraction of reagent in feed, and P=Total pressure The rate constant is calculated using the deposition rate data from the cold side of the composite, where the values of the temperature and concentration are known. The total pressure for the calculation near the cold side is calculated from the time averaged value of the inlet pressure. Similar 'k' values also are obtained for the hot side of the composite using the average outlet concentration, which are estimated from the deposition efficiency. The average outlet concentration is given by the following:

$$Y_{out}=Y_{in}(1-X) \quad (15)$$

Where, $Y_{in}$=Inlet concentration

X=Deposition Efficiency

The natural logarithm of 'k' values are plotted against the inverse absolute temperature. The data points are linearly regressed to obtain the following equation:

$$\ln k = 8.2 - 9375.1/T \quad (16)$$

Figure 8:
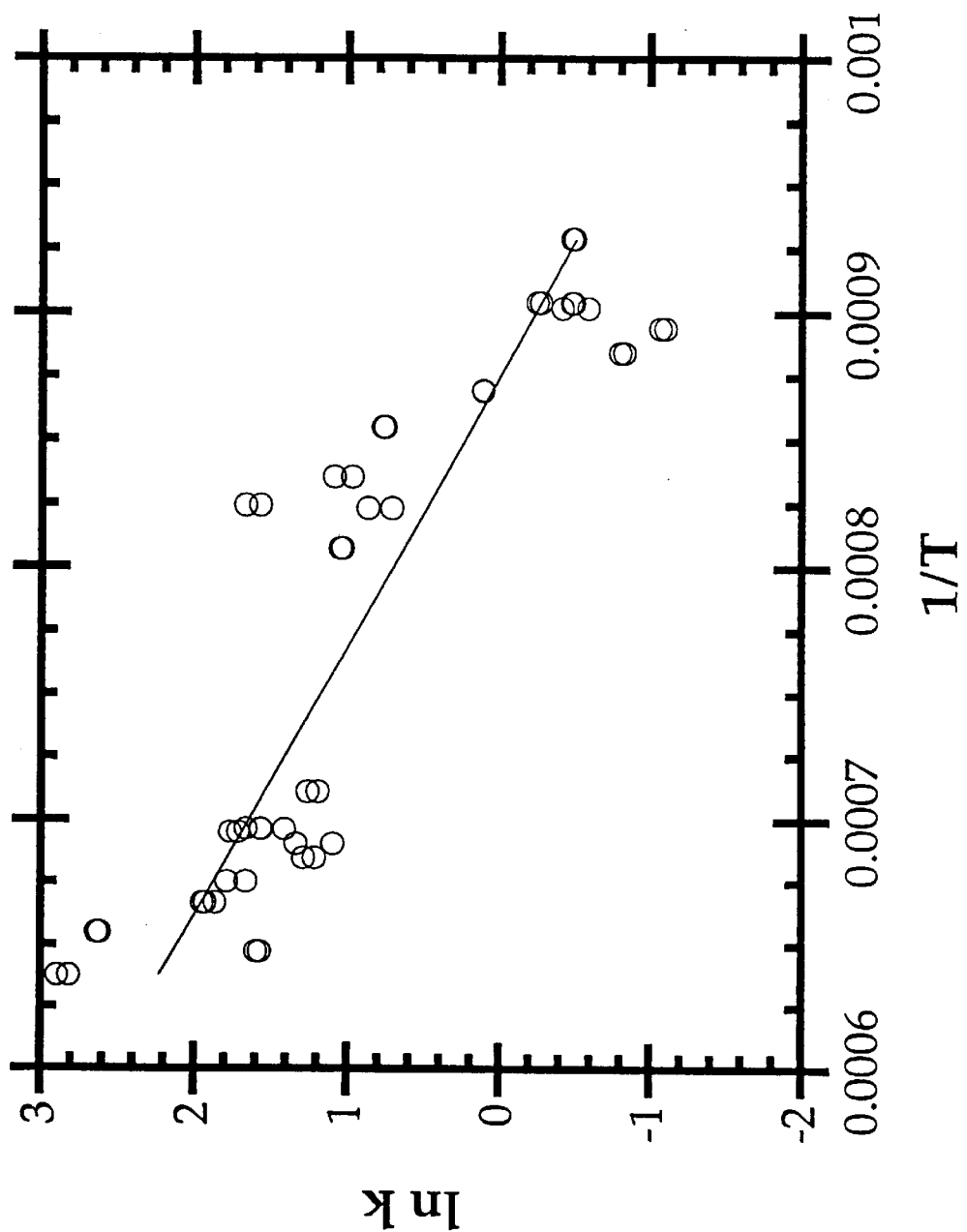
FIG. 8 shows an Arrhenius plot for deposition of carbon in the preform from propylene.
Figure 9:
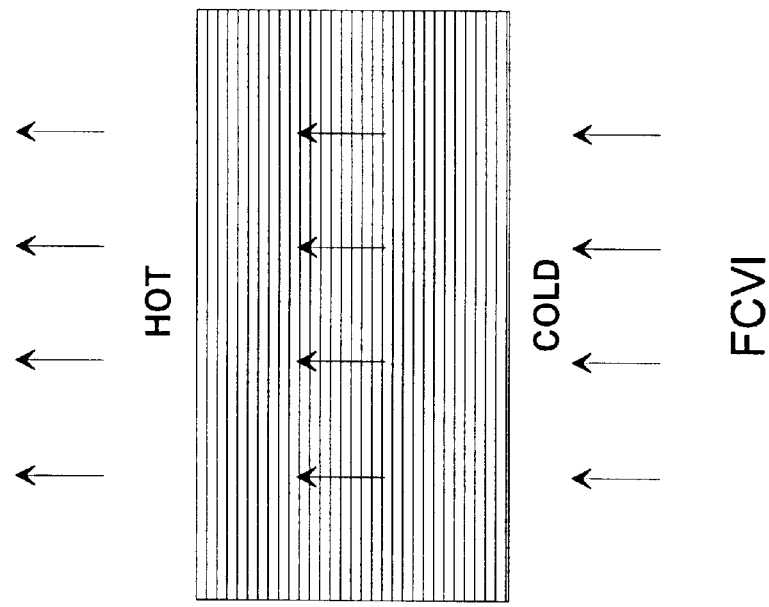
FIG. 9 shows flow patterns for the isothermal CVI and FCVI processes. The different shades indicate different densities, with ligher shade indicating less dense material.
Figure 9:
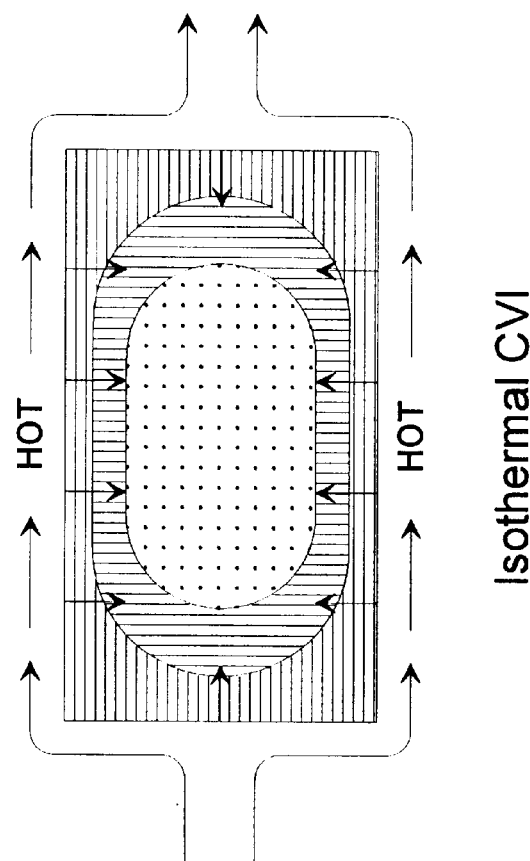
Figure 10:
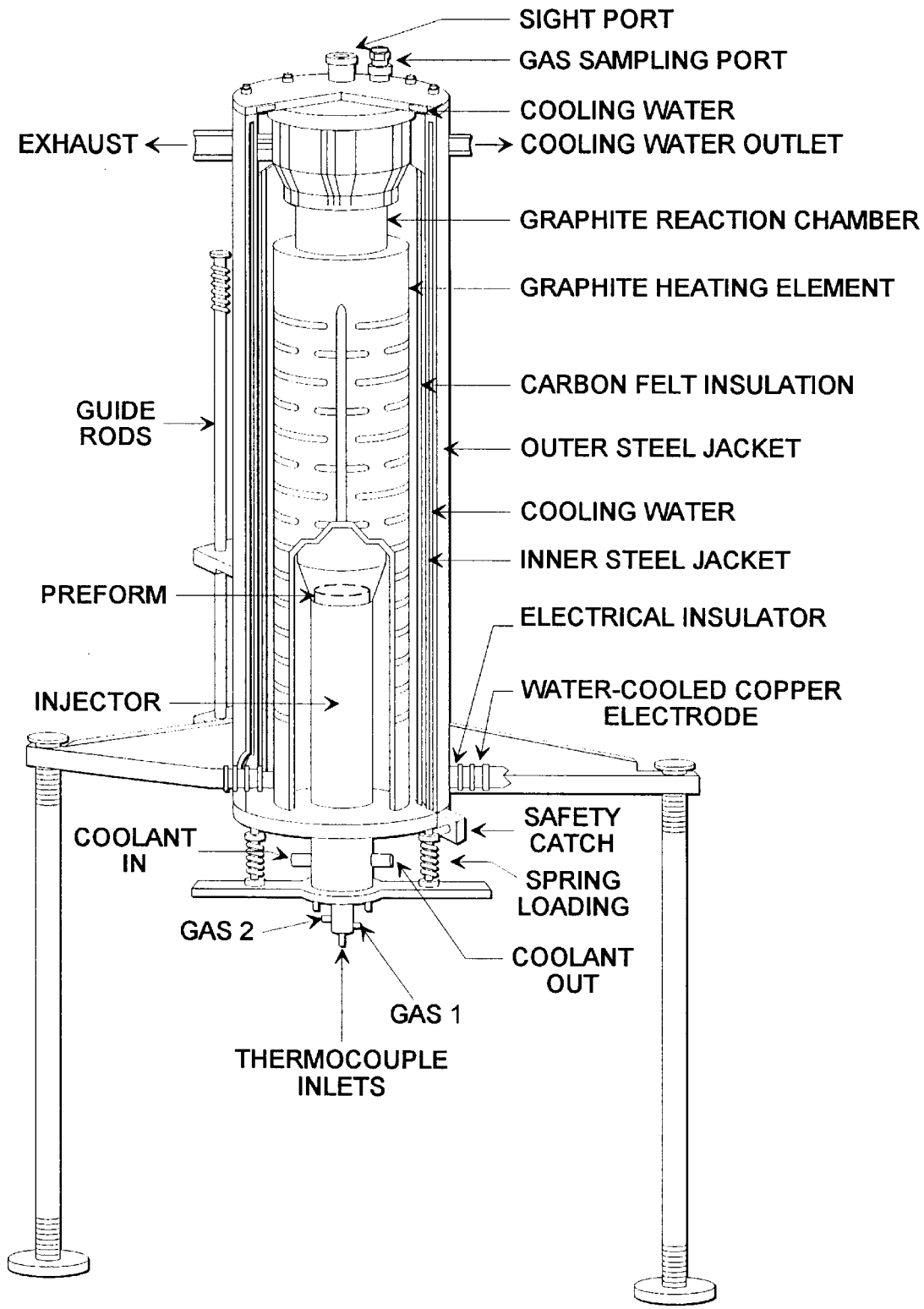
FIG. 10 shows an embodiment of a FCVI reactor for fabrication of carbon-carbon composites.
Figure 11:
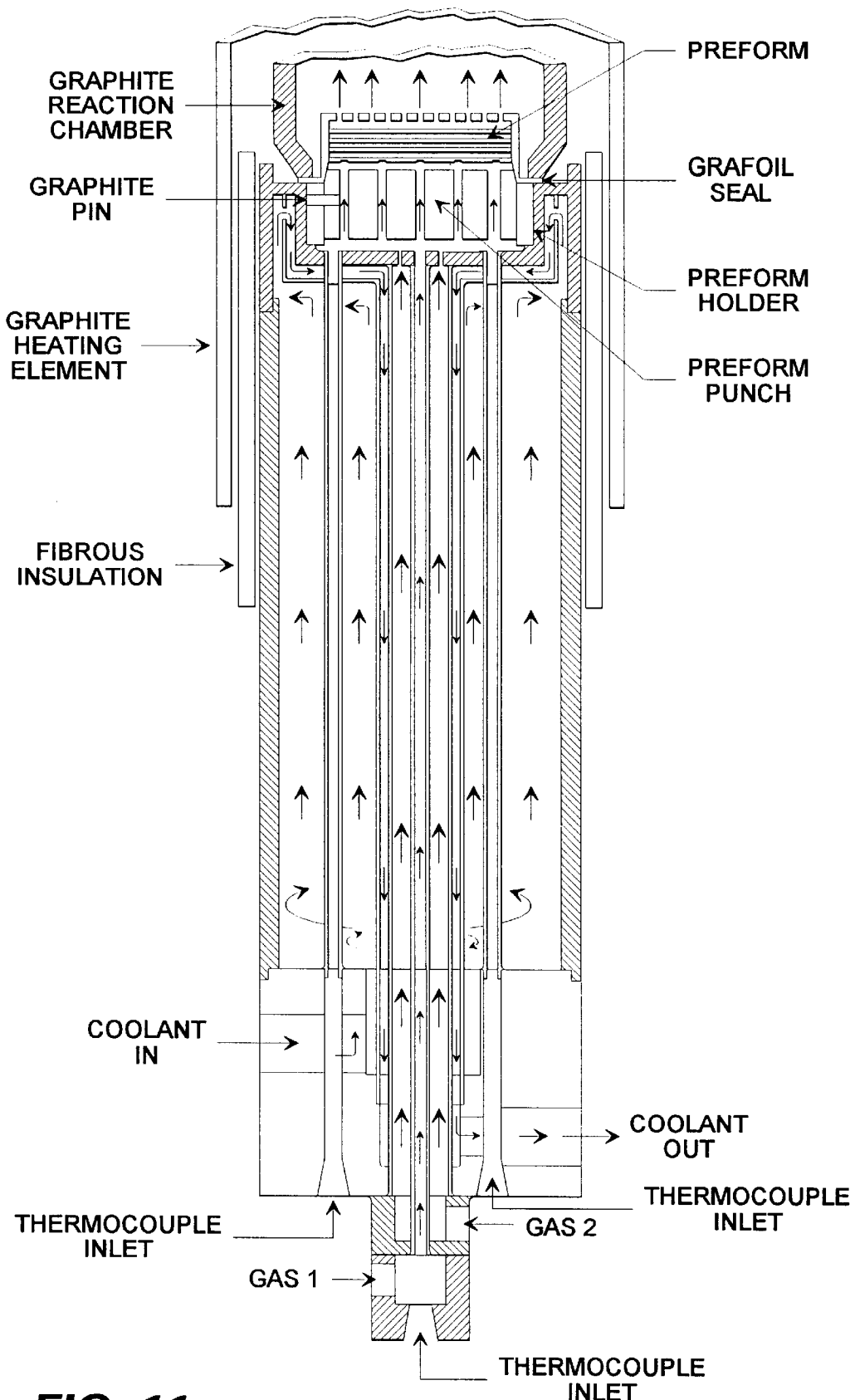
FIG. 11 shows a schematic of an embodiment of a water cooled gas injector.
Figure 12:
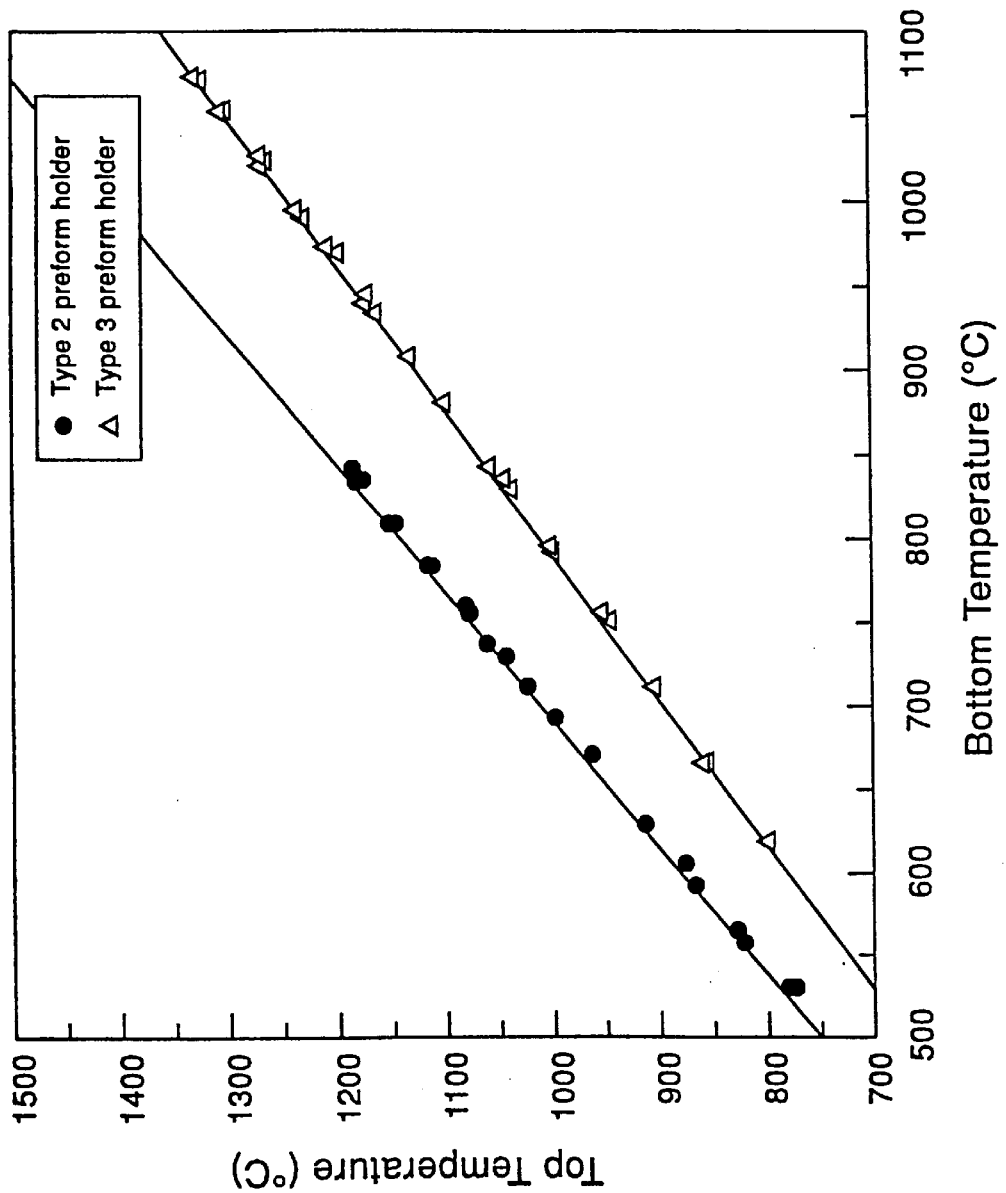
FIG. 12 shows the relationship between the bottom and top temperatures of the preform for two types of preform holders.

The resulting plot is shown in FIG. 8. The activation energy calculated from equation 16 is approximately 18.6 Kcal/mol. This value is lower than the 35–60 Kcal/mol reported for carbon deposition from propylene, by P. A. Tesner, in *Chemistry and Physics of Carbon,* edited by P. A. Thrower, 19, 65 (1983); P. McAllister, J. F. Hendricks, and E. E. Wolf *Carbon,* 28, 579 (1990). The typical activation energy for a mass transfer controlled regime is approximately 3–4 Kcal/mol. Hence, the value of activation energy suggests a transition regime. These results agree with the conclusions obtained from regression of rate of weight gain with different independent variables.

Figure 16:
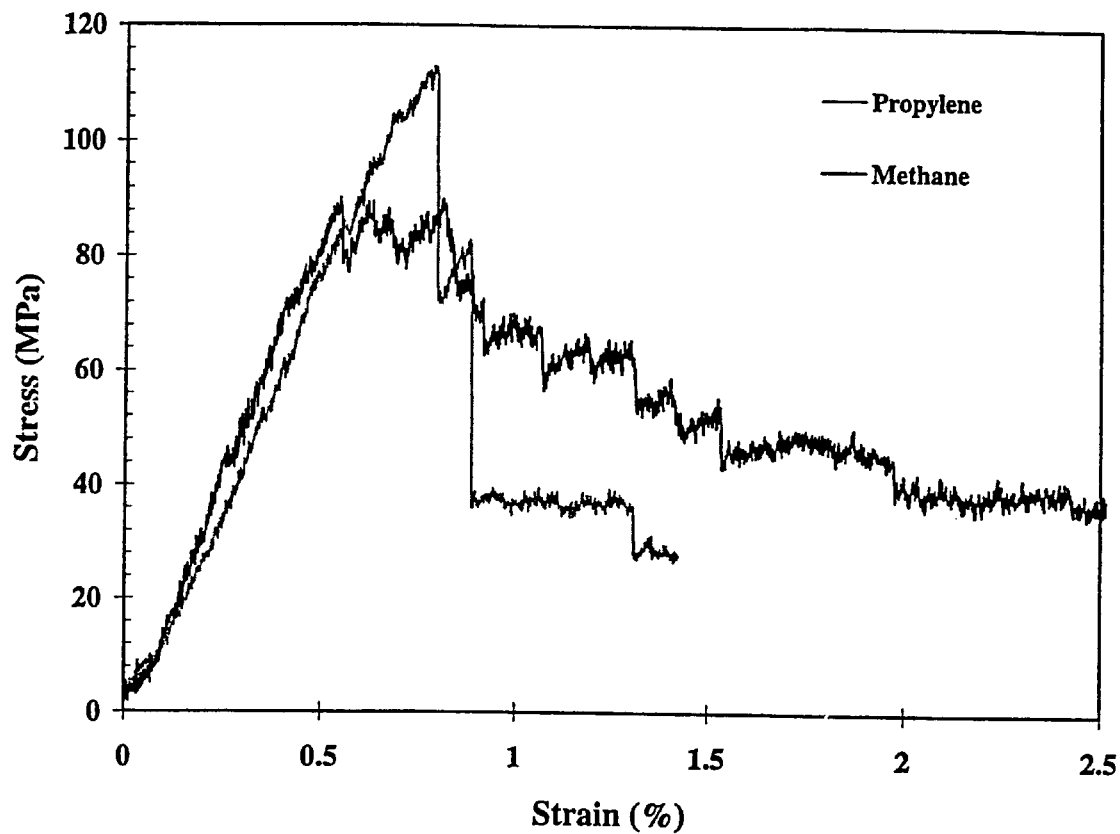
FIG. 16 shows stress-strain curves for four-point flexural testing of carbon/carbon.

FIG. 16 gives the typical stress-strain curves of composites made with propylene and methane. The composites made from propylene exhibit slightly higher strength and similar strain at failure compared to those made using methane as shown in Table 9. The module of the samples prepared using propylene and methane are similar. The mechanical properties are comparable to the results for carbon/carbon prepared using the thermal gradient method with propane, reported by S. H. Oh and J. Y. Lee, Carbon, 27, 423–430 (1989)

The strength of the composites can be further increased by modifying the layup used to make the preform. In the configuration used in the examples, the nominal fiber volume is 50% and a fiber fraction of approximately 8% is aligned with each fiber direction for a 0, 30 60° layup. This value can be increased to approximately 20–25% by employing 0–90° layup which would lead to increased strength.

The process was conducted using preforms with thicknesses of 0.2, 0.85, and 1.66 cm (10, 40, and 80 layers of cloth). With the thickest preform (PCVI-10), the temperature of the bottom cloth was about 650° C. resulting in a more porous structure in the bottom portion of the preform. This limitation can be eliminated by either employing the taller type 3 preform holder or by extending the run time. The rate of weight gain for this run is comparable to the runs carried out with 40 cloth layers at similar conditions.

For the initial run (PCVI-12) with 10 layers of cloth the preform was not sufficiently hot to achieve full densification. The preform cloth acts as insulation between the cool injector and the hot heating element resulting in the temperature gradient. The reduction in the number of cloth layers causes excess cooling. Consequently, in the following run, 15 layers of 0.025 cm thick Grafoil were added between the preform and the gas injector; holes were punched in the Grafoil to permit gas flow. The presence of the Grafoil resulted in higher preform temperatures and higher weight gain. The rate of weight gain was about 0.8 g/hour which is comparable to the rate of weight gain obtained with 0.85 cm thick preforms. These results show that the FCVI process for carbon-carbon composites is applicable to both thin and thick components.

Concentration, flow rate and preform bottom temperature affect the infiltration time and rate of weight gain. The final bulk density of the composite is independent of the processing conditions. This is attributable to the termination of the experiments at a specified back pressure. Hence, back pressure can be used to control the infiltration process. The bulk density of the slices cut from a composite sample varies only by about 20% of the average bulk density. The average deposition rate in macropores increases exponentially moving from the cold side to the hot side of the composite. The reagent depletion does not counteract the increased temperatures, even though the deposition rates vary as high as by a factor of 8. The variation of the density is at most only, 0.2 g/cm³. This is because most of the initial porosity is within the tow. The deposition rate data plotted in an Arrhenius plot results in the equation 1n k=8.2−9375.1/T, fitting the data well.

The above detailed description of the preferred embodiment and examples are for illustrative purposes only and are not intended to limit the scope of the invention or its equivalents as defined by the appended claims.

TABLE 1

Properties of the Infiltrated Composites

| Run Number | Fiber Content (v/o) | Rate of Weight Gain (g/h) | Infiltration Time (h) | Bulk Density (g/cm³) | Total Porosity (%) | Open Porosity (%) |
|---|---|---|---|---|---|---|
| Propylene |
| PCVI-6 | 52.2 | 0.36 | 24.25 | 1.48 | 18.5 | — |
| PCVI-8 | 58.3 | 1.1 | 8 | 1.69 | 7.3 | 4.2 |
| PCVI-9 | 59.9 | 0.69 | 12 | 1.69 | 7.0 | 4.1 |
| Propane |
| PACVI-16 | 50.3 | 0.88 | 14 | 1.68 | 8.0 | 3.6 |
| Methane |
| MCVI-7 | 46.3 | 0.16 | 43 | 1.23 | 32.3 | — |
| MCVI-11 | 50.5 | 0.25 | 38.5 | 1.51 | 16.9 | 5.0 |

TABLE 2

Operating Conditions for FCVI

| Run No. | Preform Holder Type | Cloth Layers | Reagent Flow Rate (sccm) | Diluent Flow Rate (sccm) | Time (h) | Preform Temperature (° C.) Top | Bottom |
|---|---|---|---|---|---|---|---|
| Propylene |
| PCVI-4 | 3 | 40 | 200 | 200 | 1.25 | 1300 | 1050 |
| PCVI-5 | 1 | 40 | 125 | 375 | 10 | — | 160 |
| PCVI-6 | 2 | 40 | 50 | 150 | 24.25 | 1180 | 830 |
| PCVI-8 | 2 | 40 | 100 | 100 | 8 | 1200 | 850 |
| PCVI-9 | 2 | 40 | 200 | 200 | 12 | 1180 | 830 |
| PCVI-10 | 2 | 80 | 100 | 100 | 23 | — | 650 |
| PCVI-12 | 2 | 10 | 100 | 100 | 2 | — | 850 |
| PCVI-13 | 2 | 10 | 100 | 100 | 2 | — | 960 |
| Methane |
| MCVI-1 | 1 | 40 | 250 | 250 | 31.5 | — | 115 |
| MCVI-3 | 2 | 40 | 250 | 250 | 6.5 | — | 560 |
| MCVI-7 | 3 | 40 | 50 | 150 | 43 | 1320 | 1108 |
| MCVI-11 | 3 | 40 | 50 | 50 | 38.5 | 1320 | 1050 |

TABLE 3

Operating Conditions for the FCVI Process

| Run Number | Preform Holder Type | Reagent Flow Rate (sccm) | Diluent Flow Rate (sccm) | Preform Temperature (° C.) Top | Bottom |
|---|---|---|---|---|---|
| Propylene |
| PCVI-6 | 2 | 50 | 150 | 1180 | 830 |
| PCVI-8 | 2 | 100 | 100 | 1200 | 850 |
| PCVI-9 | 2 | 200 | 200 | 1180 | 830 |

TABLE 3-continued

Operating Conditions for the FCVI Process

| Run Number | Preform Holder Type | Reagent Flow Rate (sccm) | Diluent Flow Rate (sccm) | Preform Temperature (° C.) Top | Bottom |
|---|---|---|---|---|---|
| Propane |
| PACVI-16 | 3 | 100 | 100 | 1190 | 940 |
| Methane |
| MCVI-7 | 3 | 50 | 150 | 1320 | 1108 |
| MCVI-11 | 3 | 50 | 50 | 1320 | 1050 |

TABLE 4

Operating conditions of the FCVI runs with propylene

| | | Actual Values | | | Coded Values | | |
|---|---|---|---|---|---|---|---|
| Run Number | Experiment | T (° C.) | C (%) | Q (cm³/min) | $T_{cod}$ | $C_{cod}$ | $Q_{cod}$ |
| PCVI-33 | (1) | 845.39 | 25 | 200 | −1.0922 | −1 | −1 |
| PCVI-24 | T | 941.71 | 25 | 200 | 0.8342 | −1 | −1 |
| PCVI-32 | C | 852.10 | 50 | 200 | −0.9581 | 1 | −1 |
| PCVI-37 | C | 835.58 | 50 | 200 | −1.2883 | 1 | −1 |
| PCVI-28 | TC | 939.88 | 50 | 200 | 0.7975 | 1 | −1 |
| PCVI-27 | Q | 857.37 | 25 | 400 | −0.8526 | −1 | 1 |
| PCVI-25 | TQ | 965.41 | 25 | 400 | 1.3081 | −1 | 1 |
| PCVI-36 | CQ | 832.96 | 50 | 400 | −1.3407 | 1 | 1 |
| PCVI-22 | TCQ | 923.91 | 50 | 400 | 0.4782 | 1 | 1 |
| PCVI-31 | TCQ | 917.67 | 50 | 400 | 0.3533 | 1 | 1 |
| PCVI-21 | Midpoint | 833.16 | 37.5 | 300 | −1.3368 | 0 | 0 |
| PCVI-23 | Midpoint | 803.25 | 37.5 | 300 | −1.9350 | 0 | 0 |
| PCVI-35 | Midpoint | 896.79 | 37.5 | 300 | −0.0642 | 0 | 0 |
| PCVI-38 | Midpoint | 877.68 | 37.5 | 300 | −0.4465 | 0 | 0 |
| PCVI-43 | — | 941.43 | 50 | 300 | 0.8286 | 1 | 0 |

TABLE 5

List of independent variables

| Variable | Name | Low Value | High Value | Coded Variables |
|---|---|---|---|---|
| T | Preform Bottom Temperature (° C.) | 850 | 950 | (T − 900) ÷ 50 |
| C | Concentration (%) | 25 | 50 | (C − 37.5) ÷ 12.5 |
| Q | Total Flow Rate (cm³/min) | 200 | 400 | (Q − 300) ÷ 100 |

TABLE 6

Properties of the infiltrated composites

| Run Number | Initial Porosity (v/o) | Infiltration Time (h) | Rate of Weight Gain (g/h) | Final Total Porosity (%) | Open Porosity (%) | Bulk Density (g/cm$^3$) | Deposition Efficiency (%) |
|---|---|---|---|---|---|---|---|
| PCVI-33 | 45.64 | 28.5 | 0.3683 | 8.00 | 4.75 | 1.677 | 7.64 |
| PCVI-24 | 45.65 | 11.5 | 0.9581 | 6.13 | 3.69 | 1.713 | 19.87 |
| PCVI-32 | 45.86 | 10.5 | 0.9776 | 8.94 | — | 1.660 | 10.14 |
| PCVI-37 | 44.59 | 9 | 1.0902 | 8.22 | 4.65 | 1.672 | 11.31 |
| PCVI-28 | 44.76 | 6 | 1.5478 | 10.77 | 7.86 | 1.624 | 16.05 |
| PCVI-27 | 44.42 | 21.5 | 0.4619 | 7.78 | 4.69 | 1.680 | 4.79 |
| PCVI-25 | 48.62 | 7 | 1.6976 | 8.04 | 4.62 | 1.680 | 17.60 |
| PCVI-36 | 46.484 | 7.75 | 1.3537 | 8.96 | 4.58 | 1.660 | 7.02 |
| PCVI-22 | 44.96 | 2.75 | 3.5133 | 9.81 | 6.56 | 1.642 | 18.22 |
| PCVI-31 | 44.25 | 2.75 | 3.0636 | 13.15 | — | 1.578 | 15.89 |
| PCVI-21 | 45.67 | 11.5 | 0.8913 | 8.72 | 5.93 | 1.664 | 8.25 |
| PCVI-23 | 45.95 | 12.25 | 0.8171 | 10.23 | 6.56 | 1.635 | 7.57 |
| PCVI-35 | 45.63 | 8.75 | 1.2481 | 6.19 | 3.85 | 1.712 | 11.45 |
| PCVI-38 | 43.90 | 8.5 | 1.1791 | 6.49 | 4.36 | 1.704 | 10.82 |
| PCVI-43 | 49.41 | 3.5 | 3.5317 | 7.15 | 3.97 | 1.698 | 24.43 |

TABLE 7

Density of the composite slices as a function of its position

| Run Number | Experiment | Bulk Density (g/cm$^3$) | | | | | | | | | | |
|---|---|---|---|---|---|---|---|---|---|---|---|---|
| | | Hot Side | | | | Middle | | | | Cold Side | | | |
| | | Inside | | Outside | | Inside | | Outside | | Inside | | Outside | |
| PCVI-33 | (1) | 1.703 | 1.726 | 1.676 | 1.715 | 1.735 | 1.708 | 1.717 | 1.727 | 1.555 | 1.52 | 1.57 | 1.566 |
| PCVI-24 | T | 1.718 | 1.714 | 1.677 | 1.681 | 1.653 | 1.65 | 1.64 | 1.67 | 1.607 | 1.625 | 1.646 | 1.633 |
| PCVI-37 | C | 1.73 | 1.721 | 1.712 | 1.637 | 1.68 | 1.663 | 1.669 | 1.623 | 1.54 | 1.567 | 1.544 | 1.516 |
| PCVI-28 | TC | 1.61 | 1.61 | 1.53 | 1.461 | 1.721 | 1.735 | 1.681 | 1.669 | 1.572 | 1.613 | 1.592 | 1.551 |
| PCVI-27 | Q | 1.74 | 1.73 | 1.71 | 1.746 | 1.72 | 1.712 | 1.698 | 1.72 | 1.467 | 1.443 | 1.49 | 1.469 |
| PCVI-25 | TQ | 1.69 | 1.659 | 1.64 | 1.699 | 1.684 | 1.681 | 1.695 | 1.71 | 1.542 | 1.58 | 1.658 | 1.59 |
| PCVI-36 | CQ | 1.746 | 1.713 | 1.676 | 1.672 | 1.705 | 1.681 | 1.61 | 1.674 | 1.556 | 1.556 | 1.504 | — |
| PCVI-22 | TCQ | 1.571 | 1.584 | 1.58 | 1.558 | 1.691 | 1.73 | 1.709 | 1.705 | 1.578 | 1.58 | 1.563 | 1.705 |
| PCVI-21 | Midpoint | 1.718 | 1.726 | 1.724 | 1.722 | 1.722 | 1.724 | 1.658 | 1.668 | 1.477 | 1.487 | 1.49 | 1.4 |
| PCVI-23 | Midpoint | 1.593 | 1.644 | 1.591 | 1.494 | 1.664 | 1.714 | 1.689 | 1.694 | 1.603 | 1.599 | 1.581 | 1.506 |
| PCVI-35 | Midpoint | 1.716 | 1.697 | 1.7 | 1.719 | 1.766 | — | 1.724 | 1.735 | 1.639 | 1.646 | 1.637 | — |
| PCVI-38 | Midpoint | 1.705 | 1.703 | 1.711 | 1.709 | 1.708 | 1.695 | 1.661 | 1.715 | 1.477 | 1.389 | 1.545 | 1.45 |
| PCVI-43 | — | 1.66 | 1.604 | 1.668 | 1.612 | 1.69 | 1.68 | 1.652 | 1.668 | 1.514 | 1.49 | 1.621 | 1.485 |

TABLE 8

Regression equation relating deposition rate (Y) in μm/h to the distance (Z) in mm from the cold side of the composite

| Radial Position | Run Number | Equation | $R^2$ |
|---|---|---|---|
| r/R = 0.0 | PCVI-33 | Y = 0.0814 Exp (0.2803 Z) | 97.3 |
| | PCVI-24 | Y = 0.5499 Exp (0.1159 Z) | 74.5 |
| | PCVI-37 | Y = 0.3831 Exp (0.2697 Z) | 99.3 |
| | PCVI-28 | Y = 2.8732 Exp (−0.1997 Z) | 75.3 |
| | PCVI-27 | Y = 0.1088 Exp (0.2747 Z) | 99.8 |
| | PCVI-25 | Y = 0.8203 Exp (0.1838 Z) | 87.6 |
| | PCVI-36 | Y = 0.4277 Exp (0.2470 Z) | 96.6 |
| | PCVI-22 | Y = 1.5426 Exp (0.1473 Z) | 91.1 |
| | PCVI-21 | Y = 0.2637 Exp (0.2475 Z) | 98.0 |
| | PCVI-23 | Y = 0.1894 Exp (0.2422 Z) | 97.3 |
| | PCVI-35 | Y = 0.8130 Exp (0.1360 Z) | 97.8 |
| | PCVI-38 | Y = 0.3846 Exp (0.2192 Z) | 96.8 |
| r/R = 0.5 | PCVI-33 | Y = 0.0659 Exp (0.2953 Z) | 97.7 |
| | PCVI-24 | Y = 0.4208 Exp (0.2238 Z) | 94.1 |
| | PCVI-37 | Y = 0.2359 Exp (0.2405 Z) | 57.1 |
| | PCVI-28 | Y = 1.9128 Exp (−0.1388 Z) | 71.8 |
| | PCVI-27 | Y = 0.0953 Exp (0.2999 Z) | 91.0 |
| | PCVI-25 | Y = 0.5307 Exp (0.2553 Z) | 91.6 |
| | PCVI-36 | Y = 0.2969 Exp (0.2482 Z) | 81.6 |
| | PCVI-22 | Y = 1.2963 Exp (0.1770 Z) | 84.5 |
| | PCVI-21 | Y = 0.1611 Exp (0.3014 Z) | 96.5 |
| | PCVI-23 | Y = 0.1579 Exp (0.2464 Z) | 99.4 |
| | PCVI-35 | Y = 0.7785 Exp (0.1543 Z) | 95.2 |
| | PCVI-38 | Y = 0.5281 Exp (0.2216 Z) | 98.8 |
| r/R = 1.0 | PCVI-33 | Y = 0.0875 Exp (0.2114 Z) | 95.8 |
| | PCVI-24 | Y = 0.4978 Exp (0.1130 Z) | 94.0 |
| | PCVI-37 | Y = 0.4958 Exp (0.08331 Z) | 72.2 |
| | PCVI-28 | Y = 1.5693 Exp (−0.3106 Z) | 77.2 |
| | PCVI-27 | Y = 0.1466 Exp (0.1855 Z) | 98.0 |
| | PCVI-25 | Y = 1.0118 Exp (0.1276 Z) | 91.4 |
| | PCVI-36 | Y = 0.4125 Exp (0.1851 Z) | 95.0 |
| | PCVI-22 | Data scattered | — |
| | PCVI-21 | Y = 0.2082 Exp (0.1887 Z) | 98.6 |
| | PCVI-23 | Y = 0.1500 Exp (0.1950 Z) | 94.5 |

TABLE 8-continued

Regression equation relating deposition rate (Y) in μm/h to the distance (Z) in mm from the cold side of the composite

| Radial Position | Run Number | Equation | $R^2$ |
|---|---|---|---|
| | PCVI-35 | Y = 0.7212 Exp (0.0788 Z) | 75.4 |
| | PCVI-38 | Y = 0.5657 Exp (0.1585 Z) | 95.7 |

TABLE 9

Mechanical Properties of Carbon/Carbon

| | Propylene CPCVI-8 | | Methane MCVI-11 | |
|---|---|---|---|---|
| Properties | Sample 1 | Sample 2 | Sample 1 | Sample 2 |
| Flexural Strength MPa (Ksi) | 113 (16.4) | 98.5 (14.3) | 90.3 (13.1) | 94.4 (13.7) |
| Flexural Modulus GPa (Msi) | 14.95 (2.17) | 16.26 (2.36) | 16.95 (2.46) | 13.37 (1.94) |
| Strain at Failure (%) | 0.77 | 0.78 | 0.8 | 1.0 |

TABLE 10

Statistically Designed Experiment with Propane

| Run Number | Experiment | Temperature at Bottom Cloth (° C.) | Reagent Concentration (%) | Total Flow Rate (cm³/min) | Infiltration Time (h) | Bulk Density (g/cm³) | Final Porosity (%) |
|---|---|---|---|---|---|---|---|
| PA-12 | (1) | 900 | 25 | 200 | 34 | 1.63 | 10.6 |
| PA-4 | A | 1000 | 25 | 200 | 19 | 1.70 | 6.84 |
| PA-14 | B | 900 | 50 | 200 | 19 | 1.64 | 9.87 |
| PA-9 | AB | 1000 | 50 | 200 | 3 | 1.38 | 23.96 |
| PA-10 | C | 900 | 25 | 400 | 34 | 1.64 | 10.02 |
| PA-13 | AC | 1000 | 25 | 400 | 18 | 1.70 | 6.78 |
| PA-7 | BC | 900 | 50 | 400 | 18.5 | 1.67 | 8.7 |
| PA-6 | ABC | 1000 | 50 | 400 | 7 | 1.68 | 8.32 |
| PA-3 | Midpoint | 950 | 37.5 | 300 | 12.5 | 1.63 | 10.68 |
| PA-11 | Midpoint | 950 | 37.5 | 300 | 12.5 | 1.64 | 9.95 |

TABLE 11

Properties of the Infiltrated Composites

| Run No. | Fiber Content (v/o) | Rate of Weight Gain (g/h) | Bulk Density (g/cm³) | Total Porosity (%) | Open Porosity (%) | Deposition Efficiency (%) |
|---|---|---|---|---|---|---|
| PCVI-4 | 40.8 | 1.73 | 0.861 | 51.9 | — | 27.0 |
| PCVI-5 | 37.5 | ~0 | — | — | — | ~0 |
| PCVI-6 | 52.2 | 0.36 | 1.480 | 18.5 | — | 22.2 |
| PCVI-8 | 58.3 | 1.10 | 1.686 | 7.3 | 1.0 | 34.1 |
| PCVI-9 | 59.9 | 0.69 | 1.689 | 7.0 | 1.1 | 10.8 |
| PCVI-10 | 51.4 | 0.77 | 1.513 | 16.9 | 0.8 | 23.9 |
| PCVI-12 | 75.7* | 0.19 | 1.478 | 17.0 | — | 5.8 |
| PCVI-13 | 43.0 | 0.73 | 1.120 | 38.1 | 5.9 | 22.8 |
| Methane | | | | | | |
| MCVI-1 | 37.5 | ~0 | — | — | — | ~0 |
| MCVI-3 | 52.2 | ~0 | — | — | — | ~0 |
| MCVI-7 | 46.3 | 0.16 | 1.226 | 32.3 | — | 10.0 |
| MCVI-11 | 50.5 | 0.25 | 1.514 | 16.9 | 1.1 | 15.4 |

*Compacted to higher than typical pressure

What is claimed is:

1. A method for fabricating carbon fiber-carbon matrix composites comprising the steps of:

a. preparing a preform consisting essentially of multiple layers of carbon cloth;

b. placing the preform in a furnace reactor chamber comprising a feed end and a discharge end, wherein said preform approximately conforms in dimension and shape to the inside walls of said furnace reactor chamber;

c. establishing a thermal gradient across the preform;

d. introducing a process feed gas comprising a carbon source into the furnace reactor chamber through the feed end; and f. establishing a pressure gradient across said preform by maintaining the pressure at the feed end approximately 3.4 kPa or more above the pressure at the discharge end, thereby forcing the process feed gas to flow through the preform resulting in the deposition of carbon from the carbon source within the preform, the pressure at the feed end increasing as the carbon is deposited within the preform.

2. The method as claimed in claim 1, wherein said multiple layers of carbon cloth are each oriented in an offset rotational angle to neighboring layers of carbon cloth.

3. The method as claimed in claim 2, wherein said furnace is heated to a temperature of between 400° C. and 2000° C.

4. The method as claimed in claim 3 wherein said carbon source is a hydrocarbon or a mixture of hydrocarbons.

5. The method as claimed in claim 4, wherein said carbon source is selected from the group consisting of propylene, propane and methane.

6. The method as claimed in claim 5, wherein said process feed gas further comprises a diluent.

7. The method as claimed in claim 6, wherein said diluent is hydrogen.

8. The method as claimed in claim 1, wherein step c through e are continued for from 3 to 12 hours.

9. The method of claim 1 wherein the deposition of carbon from the carbon source within the preform results in a back pressure of the process feed gas and said back pressure is used to monitor progress of densification of the composites.

10. A method for fabricating carbon-carbon matrix composites comprising the steps of:

a. preparing one or more preforms selected from the group consisting of chopped carbon fibers, carbon weaves, three dimensional carbon weaves, carbon particles, carbon whiskers, graphite, and mixture thereof;

b. placing the preforms in a furnace reactor chamber comprising a feed end and a discharge end wherein said preforms together approximately conform in dimension and shape to the inside walls of said furnace reactor chamber;

c. establishing a thermal gradient across the preforms;

d. introducing a process feed gas comprising a carbon source into the furnace through the feed end; and f. establishing a pressure gradient across said preforms by maintaining the pressure at the feed end approximately 3.4 kPa or more above the pressure at the discharge end, thereby forcing the process feed gas to flow through the preform resulting in the deposition of carbon from the carbon source within the preform, the pressure at the feed end increasing as the carbon is deposited within the preform.

11. The method as claimed in claim 10, wherein said furnace is heated to a temperature of between 400° C. and 2000° C.

12. The method as claimed in claim 11 wherein said carbon source is a hydrocarbon or a mixture of hydrocarbons.

13. The method as claimed in claim 12, wherein said carbon source is selected from the group consisting of propylene, propane and methane.

14. The method as claimed in claim 13, wherein said process feed gas further comprises a diluent.

15. The method as claimed in claim 14, wherein said diluent is hydrogen.

16. The method as claimed in claim 10, wherein step c through e are continued for from 3 to 12 hours.

17. The method of claim 10 wherein the deposition of carbon from the carbon source within the preforms results in a back pressure of the process feed gas and said back pressure is used to monitor progress of densification of the composites.

18. A method for fabricating carbon-carbon matrix composites comprising the steps of:

a. preparing one or more preforms selected from the group consisting of carbon cloth, chopped carbon fibers, carbon weaves, three dimensional carbon weaves, carbon particles, carbon whiskers, graphite, and mixture thereof;

b. placing said preforms in preform holders wherein said preforms approximately conform in dimension and shape to the inside walls of said preform holders;

c. placing said preform holders in a furnace comprising a feed end and a discharge end;

d. establishing a thermal gradient across the preforms;

e. introducing a process feed gas comprising a carbon source into the furnace through the feed end; and f. establishing a pressure gradient across said preforms by maintaining the pressure at the feed end approximately 3.4 kPa or more above the pressure at the discharge end, thereby forcing substantially all of the process feed gas to flow through the preforms resulting in the deposition of carbon from the carbon source within the preforms, the pressure at the feed end increasing as the carbon is deposited within the preforms.

19. The method as claimed in claim 18, wherein said furnace is heated to a temperature of between 400° C. and 2000° C.

20. The method as claimed in claim 19 wherein said carbon source is a hydrocarbon or a mixture of hydrocarbons.

21. The method as claimed in claim 20, wherein said carbon source is selected from the group consisting of propylene, propane and methane.

22. The method as claimed in claim 21, wherein said process feed gas further comprises a diluent.

23. The method as claimed in claim 22, wherein said diluent is hydrogen.

24. The method as claimed in claim 18, wherein steps d through f are continued from 3 to 12 hours.

25. The method of claim 18 wherein the deposition of carbon from the carbon source within the preforms results in a back pressure of the process feed gas and said back pressure is used to monitor progress of densification of the composites.

* * * * *